(12) United States Patent
Nakanishi et al.

(10) Patent No.: US 8,692,283 B2
(45) Date of Patent: Apr. 8, 2014

(54) LIGHT-TRANSMITTING METAL ELECTRODE, ELECTRONIC APPARATUS AND LIGHT EMITTING DEVICE

(75) Inventors: Tsutomu Nakanishi, Tokyo (JP); Akira Fujimoto, Kanagawa-ken (JP); Ryota Kitagawa, Tokyo (JP); Kumi Masunaga, Kanagawa-ken (JP); Kenji Nakamura, Kanagawa-ken (JP); Koji Asakawa, Kanagawa-ken (JP); Shinji Nunotani, Fukuoka-ken (JP); Takanobu Kamakura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 13/407,291

(22) Filed: Feb. 28, 2012

(65) Prior Publication Data

US 2013/0075778 A1    Mar. 28, 2013

(30) Foreign Application Priority Data

Sep. 26, 2011 (JP) ................................. 2011-208746

(51) Int. Cl.
*H01L 33/40* (2010.01)
(52) U.S. Cl.
USPC ................... 257/99; 257/E33.063; 174/126.2
(58) Field of Classification Search
USPC .......... 257/99, E33.063; 174/126.2; 977/762; 99/762
See application file for complete search history.

(56) References Cited

U.S. PATENT DOCUMENTS

2011/0248401 A1* 10/2011 Hellstrom et al. ............ 257/741
2011/0273085 A1* 11/2011 Garbar et al. ................. 313/509

FOREIGN PATENT DOCUMENTS

| JP | 3207182 | 7/2001 |
| JP | 2009-076361 | 4/2009 |
| JP | 2009-199990 | 9/2009 |
| JP | 2009-253016 | 10/2009 |

OTHER PUBLICATIONS

Japanese Patent Disclosure (Kokai) No. JP 2009-253016, discloses a transparent conducting film which is aggregated metal nano-wires at random. An English language abstract of this document is also enclosed.
Japanese Patent Disclosure (Kokai) No. JP 2009-199990, discloses a transparent metal film which is perforated circular nano-aperatures. An English language abstract of this document is also enclosed.

(Continued)

*Primary Examiner* — Roy Potter
(74) *Attorney, Agent, or Firm* — Finnegan, Henderson, Farabow, Garrett & Dunner, L.L.P.

(57) ABSTRACT

According to one embodiment, a light-transmitting metal electrode includes a metal layer. The metal layer is provided on a major surface of a member and includes a metal nanowire and a plurality of openings formed with the metal nanowire. The thin layer includes a plurality of first straight line parts along a first direction and a plurality of second straight line parts along a direction different from the first direction. A maximum length of the first line parts along the first direction and a maximum length of the second line parts along the direction different from the first direction are not more than a wave length of visible light. A ratio of an area of the metal layer viewed in a normal direction of the surface to an area of the metal layer viewed in the normal direction is more than 20% and not more than 80%.

20 Claims, 13 Drawing Sheets

(56) References Cited

OTHER PUBLICATIONS

Japanese Patent Disclosure (Kokai) No. JP 2009-076361, discloses a transparent metal film which is perforated circular nano-aperatures. An English language abstract of this document is also enclosed.

Japanese Patent No. JP 3207182, discloses a transparent conducting film which is perforated nano-apertures. The opening portion of the film is less than 20%. An English language abstract of the publication No. JP-2000-101114 of this document is also enclosed.

Chen et al.; "High Transmission and Low Color Cross-Talk Plasmonic Color Filters Using Triangular-Lattice Hole Arrays in Aluminum Films", Optics Express, vol. 18, No. 13, pp. 14056-14062, (2010).

Minami; "Transparent Conducting Oxide Semiconductors for Transparent Electrodes", Semiconductor Science and Technology, vol. 20. No. 4, pp. S35-S44, (2005).

\* cited by examiner

LIGHT-TRANSMITTING METAL ELECTRODE, ELECTRONIC APPARATUS AND LIGHT EMITTING DEVICE

CROSS-REFERENCE TO RELATED APPLICATIONS

This application is based upon and claims the benefit of priority from the prior Japanese Patent Application No. 2011-208746, filed on Sep. 26, 2011; the entire contents of which are incorporated herein by reference.

FIELD

Embodiments described herein relate generally to a light-transmitting metal electrode, an electronic apparatus and a light emitting device.

BACKGROUND

In display devices represented by a liquid crystal display, light emitting devices, such as, a semiconductor light emitting element and an organic electroluminescence element, photoelectric conversion devices, such as, a solar cell and a photodetector, or the like, ITO (Indium Tin Oxide), which is one of conductive oxide materials, is widely used as a light-transmitting electrode. The transmittance in a visible light region of an electrode with an ITO film formed on a glass substrate, is about 80%. On the other hand, the resistivity of ITO is about $10^{-4}$ Ω-cm, which is higher than the resistivity of a general metal material by about two orders of magnitude.

A light-transmitting metal electrode, in which an opening having a circumference length shorter than the wavelength of used light is provided in a metal thin film, is also considered. In this light-transmitting metal electrode, the reflectance loss in a metal part is reduced by making the rate of an area occupied by the metal part not more than 20%, preferably, not more than 10%. There is room for improvement in such a light-transmitting metal electrode, in order to obtain sufficient transparency in a broad wavelength range, while maintaining low electric resistance.

DETAILED DESCRIPTION

Figure 1:
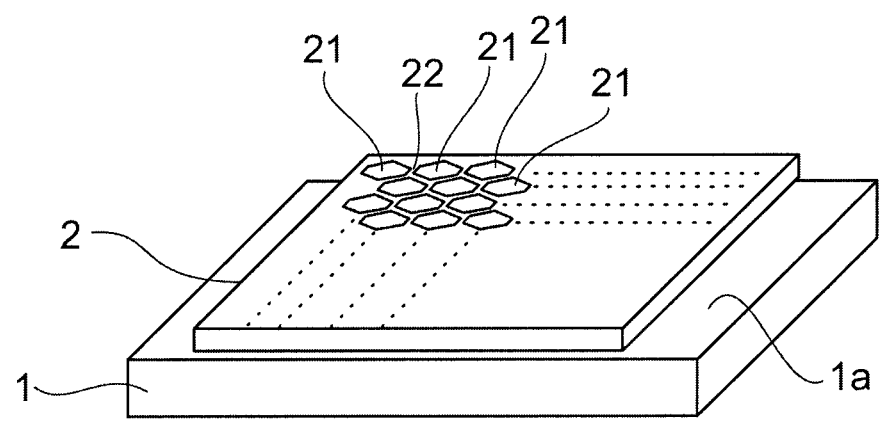
FIG. 1 is a schematic perspective view illustrating the structure of a light-transmitting metal electrode embodiment.

In general, according to one embodiment, a light-transmitting metal electrode includes a metal layer. The metal layer is provided on a major surface of a member. The metal layer includes a metal nanowire and a plurality of openings formed with the metal nanowire. The metal thin layer includes a plurality of first straight line parts along a first direction parallel to the major surface, and a plurality of second straight line parts along a direction parallel to the major surface, and different from and intersecting the first direction. A maximum length of the plurality of first straight line parts along the first direction and a maximum length of the plurality of second straight line parts along the direction different from the first direction are not more than a wave length of visible light. A ratio of an area of the metal nanowire viewed in a normal direction of the major surface to an area of the metal layer viewed in the normal direction is more than 20% and not more than 80%.

Embodiments of the invention will now be described with reference to the drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing therein above are marked with like reference numerals, and a detailed description is omitted as appropriate.

As a light-transmitting electric conductor of which resistivity can be made lower compared to a conventional transparent conductive oxide, there is a metal nano-structure obtained by periodically forming nano-meter order circular openings in a metal thin film. When light enters this metal nano-structure, an extraordinary light transmission phenomenon may occur. The phenomenon is derived from an event in which when light enters the metal thin film with nano-openings formed therein a localized electric field originating from surface electric charges is generated at the edges of the nano-openings, and since the localized electric field vibrates similarly to the incident electric field, light is re-emitted. Transmission of light with a specific wavelength is enhanced by interference between the light re-emitted from the respective nano-openings interferes with light from neighboring nano-openings. Therefore, the transmission spectrum of the metal nano-structure becomes a spectrum having peaks at specific wavelengths corresponding to a material of the metal thin film, periods and aperture diameters of the circular nano-openings, and permittivity of the circumference medium, and, depending on conditions, such as, the thickness of the metal film, it is possible to achieve transmittance not less than the aperture ratio. Since, usual metal materials can be used for the material of the metal nano-structure, the metal nano-structure can be used as a transparent electrode having a higher carrier density and lower resistivity than a conventional transparent conductive oxide. However, in the transmission spectrum of the metal nano-structure, after a peak at a specific wavelength, the reflectance increases remarkably at a longer wavelength side with respect to the peak wavelength. Therefore, if this metal nano-structure is used as a light-transmitting electrode, it is not possible to achieve high transparency throughout the operating wavelength range. Therefore, if the light-transmitting electrode is applied for devices, such as, a display device and an illuminating device, which are required to have high transparency throughout the entire visible light range, a problem of, such as, reduction of visibility due to wavelength dependence appearing in a luminescent color will occur.

On the other hand, as described in back ground arts, the light-transmitting electrode, in which openings having a circumference length shorter than the wavelength of used light are provided, is known. In the light-transmitting metal electrode, high transparency can be achieved in a broad wavelength range by making the rate of an area occupied by the metal part not more than 20%, preferably, not more than 10% to reduce the reflectance loss. However, in order to achieve high transparency in a broad wavelength range, it is required to make the rate of an area occupied by the metal part not more than 20%, and thus, resistivity of the electrode will be remarkably larger than the resistivity of a bulk metal material. As a result, the resistivity will be comparable to or not less than the resistivity of a conventional transparent conductive oxide. That is, the light-transmitting electrode has a problem to satisfy two characteristics of having the resistivity lower than the resistivity of a conventional transparent conductive oxide and having high transparency in a broad wavelength range.

First Embodiment

FIG. 1 is a schematic perspective view illustrating the structure of a light-transmitting metal electrode according to a first embodiment.

Figure 2A:
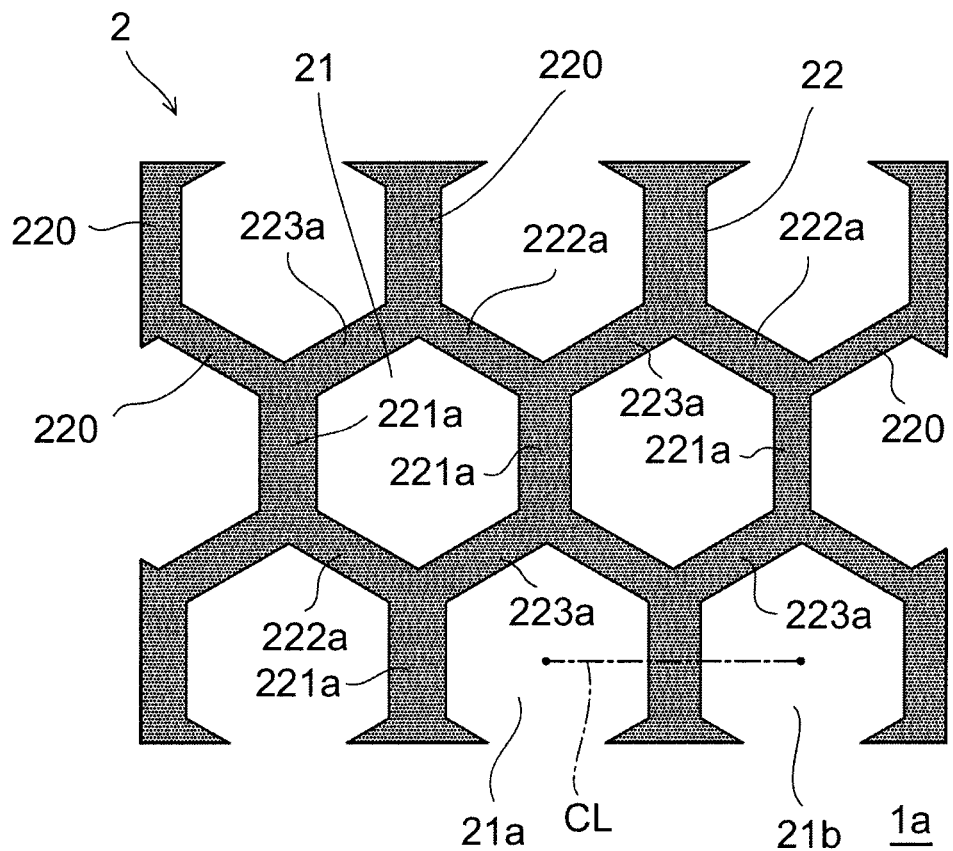
FIGS. 2A and 2B are schematic plan views in which a part of a metal layer is enlarged.
Figure 2B:
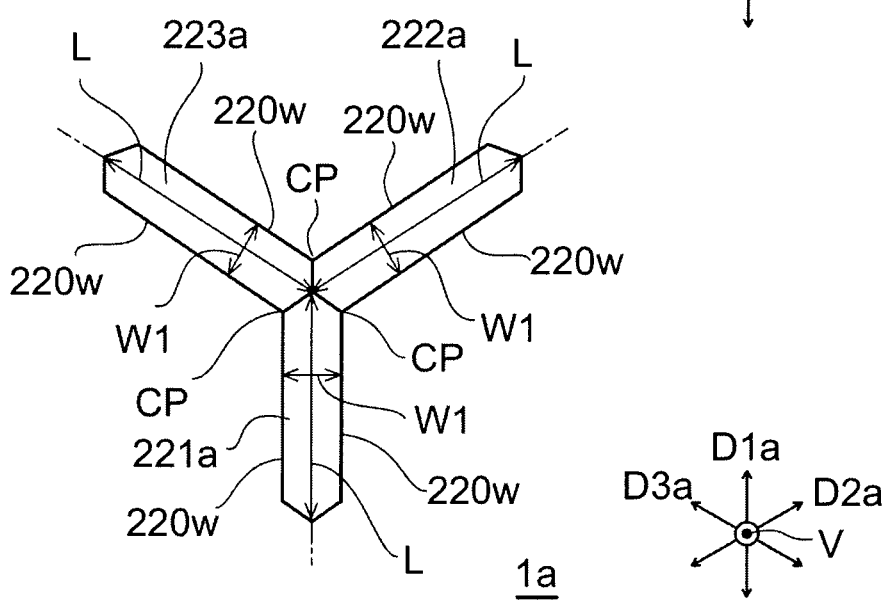

FIGS. 2A and 2b are schematic plan views in which a part of a metal layer is enlarged.

FIG. 2B is a partially enlarged view of FIG. 2A.

As shown in the FIG. 1, a light-transmitting metal electrode according to an embodiment is a metal layer 2 provided on the major surface is of a member 1. The metal layer 2 has a metal nanowire 22 and a plurality of openings 21 formed with the metal nanowire 22. That is, the light-transmitting metal electrode is configured with the plurality of openings 21 and the metal nanowire 22 provided among the plurality of openings 21.

As shown in FIG. 2A, the metal nanowire 22 has a plurality of straight line parts 220 along a direction parallel to the major surface is of the member 1. The plurality of straight line parts 220 at least have a plurality of straight line parts 221a along a direction D1a parallel to the major surface 1a and a plurality of straight line parts 222a along a direction D2a parallel to the major surface 1a and intersecting the direction D1a.

In the embodiment, the plurality of straight line parts are collectively referred to as straight line parts 220.

Further, in the embodiment, the direction D1a is defined as a first direction and the direction D2a is defined as a second direction. Straight line parts 220 along the first direction are defined as first straight line parts, and straight line parts 220 along the second direction are defined as second straight line parts. In addition, the direction D2a may be the first direction, and the direction D1a may be the second direction. When three or more directions along which the plurality of straight line parts 20 extend are present, any one of the directions is defined as the first direction, and any one of the directions other than the first directions is defined as the second direction.

In the light-transmitting metal electrode, the maximum length of the plurality of the first straight line parts along the first direction is not more than the wavelength of visible light. For example, the maximum length of the plurality of straight line parts 221a along the direction D1 is not more than the wavelength of visible light.

Further, the maximum length of the plurality of the second straight line parts along the second direction is not more than the wavelength of visible light. For example, the maximum length of the plurality of straight line parts 222a along the direction D2 is not more than the wavelength of visible light.

Furthermore, in the light-transmitting metal electrode, the ratio of the area of the metal nanowire 22 viewed in the normal direction V of the major surface is to the area of the metal layer 2 viewed in the normal direction V is more than 20% and not more than 80%.

In such a light-transmitting metal electrode, while maintaining low electric resistance, high transparency can be achieved in a broad wavelength range.

The member 1 holds the metal layer 2 which is a light-transmitting metal electrode. The material of the member 1 is not limited especially as long as it can support the metal layer 2. For example, a transparent substrate, such as, a quartz substrate and a glass substrate; a semiconductor substrate, such as, a silicon substrate and a gallium arsenide substrate; and a plastic substrate, such as, a substrate of polyethylene terephthalate, are used for the member 1. The member 1 may be a structure made by stacking semiconductor materials etc.

The thickness of the member 1 is not limited especially as long as it can support the metal layer 2. In order to achieve sufficient strength, it is preferable for the thickness of the member 1 to be, for example, not less than 5 μm.

The metal layer 2 acts as an electrode. As a material of the metal layer 2, it is preferable to use gold, silver, copper, aluminum, nickel, lead, zinc, platinum, cobalt, magnesium, chromium, tungsten, palladium, indium, antimony, tin, or an alloy material containing at least one or more of them. Such a material has resistivity sufficiently lower than the resistivity of a material for a transparent conductive oxide (for example, ITO). Further, such a material has negative permittivity in a visible light region, and exhibits metallic optical properties.

It is desirable for the thickness (thickness along the normal direction V) of the metal layer 2 to be not less than 10 nm and not more than 400 nm. It is not preferable for the thickness of the metal layer 2 to be less than 10 nm, because the resistivity of the metal electrode layer increases. On the other hand, it is not preferable for the thickness of the metal layer 2 to be more than 400 nm, because the transparency of the metal layer 2 decreases.

The shape of the plurality of openings 21 viewed in the normal direction V is made polygon by the plurality of straight line parts 220.

Here, angle CP (see FIG. 2B) of the polygon in the specification referred to as a portion where respective side walls 220w of two straight line parts (for example, straight line parts 221a and 222a) each directing different directions intersect. As the angle CP of the polygon, one rounded a little in fabrication is also included.

The shape of the plurality of openings 21 is at least one of, for example, tetragon, hexagon, and octagon.

The metal layer 2 illustrated in FIG. 2A includes hexagonal openings 21. In an example of the metal layer 2 shown in FIGS. 2A and 2B, straight line parts 221a, 222a, and 223a along three mutually different directions (directions D1a, D2a, and D3a), are provided along the major surface 1a.

The metal nanowire 22 has a structure made by connecting the straight line parts 221a, 222a and 223a. As shown in FIG.

2B, length L of the straight line parts 220 is the length of a straight line connecting points where the central lines of straight line parts 220 intersect each other. That is, the length L of the straight line parts 220 denotes the maximum length of a structure obtained by projecting the above structure on a plane parallel to directions in which the straight line parts 220 extend. Maximum length L of each of the straight line parts 221a, 222a and 223a is not more than the wavelength of visible light.

In the embodiment, the wavelength of visible light is, for example, 780 nm.

Lengths of the plurality of straight line parts 220 may be equal to each other or different from each other.

Further, the length (width) of the metal nanowire 22 on the straight line CL connecting centroids of two neighboring openings (for example, openings 21a and 21b shown in FIG. 2A) of the plurality of openings 21 is not less than 20 nm and not more than 200 nm.

Figure 3A:
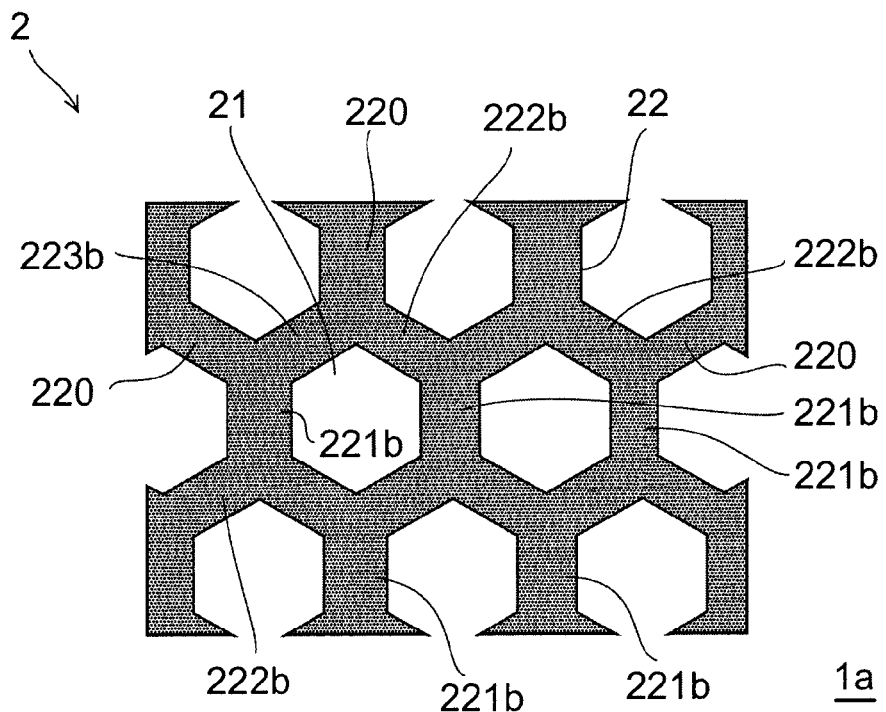
FIGS. 3A and 3B are schematic plan views showing examples of other metal layers.
Figure 3B:
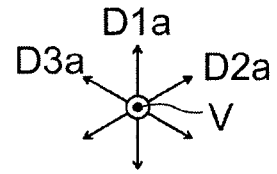

FIGS. 3A and 3B are schematic plan views showing examples of other metal layers.

FIG. 2B is a partially enlarged view of FIG. 3A.

The width W2 of the straight line parts 220 (straight line parts 221b, 222b and 223b) shown in FIG. 3B is wider than the width W1 of the straight line parts 220 (straight line parts 221a, 222a and 223a) shown in FIG. 2B.

Here, width is referred to as a width along a direction orthogonal to directions parallel to the major surface 1a along which the straight line parts 220 extend. When pitches of the openings 21 are equal to each other, as the width of each straight line part 220 becomes wider, the occupancy of the metal nanowire 22 becomes higher. Where, when the metal layer 2 is viewed in the normal direction V, the occupancy of the metal nanowire 22 is referred to as the rate of an area occupied by the metal nanowire 22 to the area of the metal layer 2 (sum of the area of the metal nanowire 22 and the area of the plurality of openings 21 viewed in the normal direction V).

For the light-transmitting metal electrode according to the embodiment, it is preferable for the maximum length L to be not less than 20 nm and not more than 780 nm. From a viewpoint of the fabrication yield, it is not preferable for the length L to be less than 20 nm, because fabrication of the metal layer 2 will be difficult. Further, it is not preferable for the length L to be more than 780 nm, because the transparency in a visible light region will decrease.

The shape of the openings 21 is not limited especially as long as it is a polygon. Openings 21 having different polygonal shapes may be included in one metal layer 2. Typical polygonal shapes include a tetragon, a hexagon, and an octagon, etc. It is not required for the shape of the openings 21 to be a regular polygon, and the length of each side may differ from each other. Further, the shape may be any of a convex polygon and a concave polygon.

Figure 4:
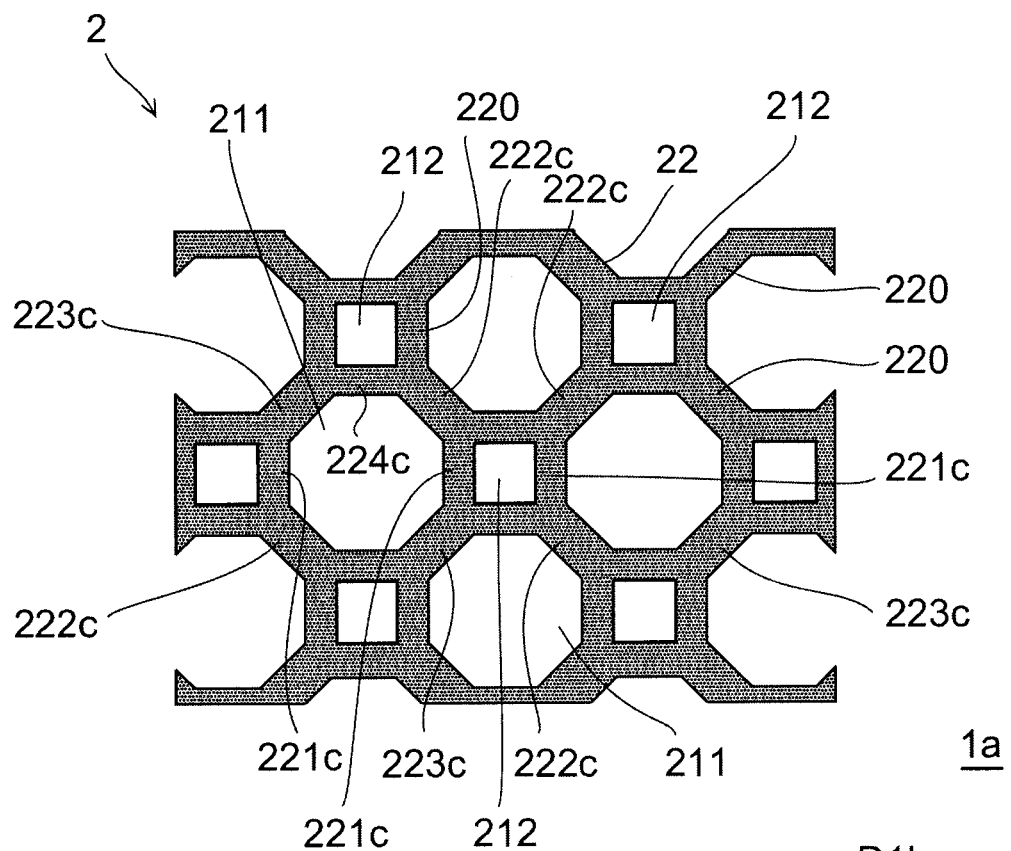
FIGS. 4 to 6 are schematic plan views illustrating another metal layer.
Figure 4:
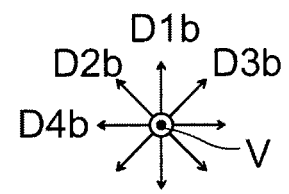

FIG. 4 is a schematic plan view illustrating another metal layer.

In the metal layer 2 shown in FIG. 4, octagonal openings 211 and tetragonal (square) openings 212 are combined by a plurality of straight line parts 220 along four different directions. Straight line parts 221c along direction D1b, straight line parts 222c along direction D2b, straight line parts 223c along direction D3b, and straight line parts 224c along direction D4b, are included by the plurality of straight line parts 220.

The plurality of octagonal openings 211 are arranged in a zigzag manner along the major surface 1a. Each of the plurality of tetragonal openings 212 is arranged among the plurality of octagonal openings 211. Accordingly, the plurality of tetragonal openings 212 are also arranged in a zigzag manner along the major surface 1a.

In the metal layer 2 shown in FIG. 4, lengths of the straight line parts 221c, 222c, 223c, and 224c are not more than the wavelength of visible light. For example, the lengths of the straight line parts 221c, 222c, 223c, and 224c are equal to each other.

Figure 5:
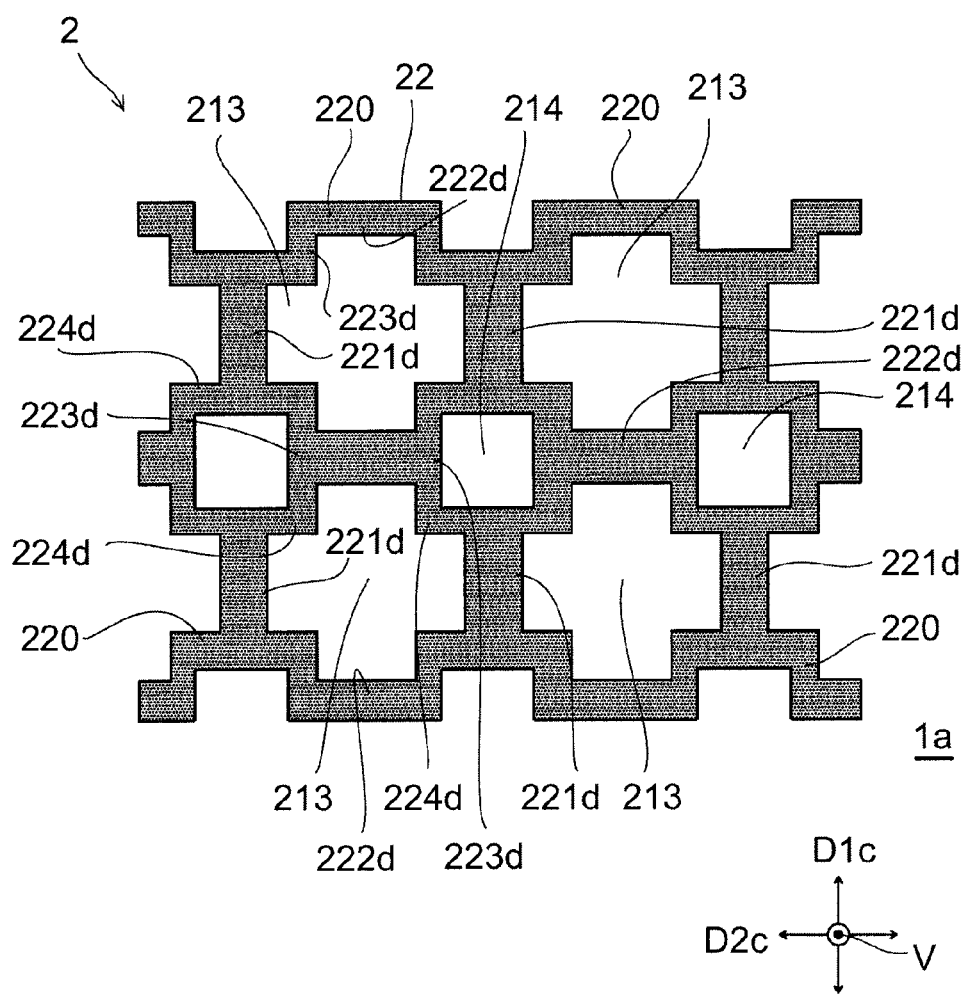

FIG. 5 is a schematic plan view illustrating another metal layer.

In the metal layer 2 illustrated in FIG. 5, dodecagonal openings 213 and tetragonal (square) openings 214 are combined by a plurality of straight line parts 220 along two different directions. Straight line parts 221d and 223d along direction D1c, and straight line parts 222d and 224d along direction D2b, are included by the plurality of straight line parts 220.

The plurality of dodecagonal openings 213 are arranged in a matrix along the major surface 1a. Each of the plurality of tetragonal openings 214 is arranged among the plurality of octagonal openings 213. Accordingly the plurality of openings 212 are also arranged in a matrix along the major surface 1a.

In the metal layer 2 shown in FIG. 5, lengths of the straight line parts 221d, 222d, 223d, and 224d are not more than the wavelength of visible light. For example, the lengths of the straight line parts 221d, 222d, 223d, and 224d are equal to each other.

Figure 6:
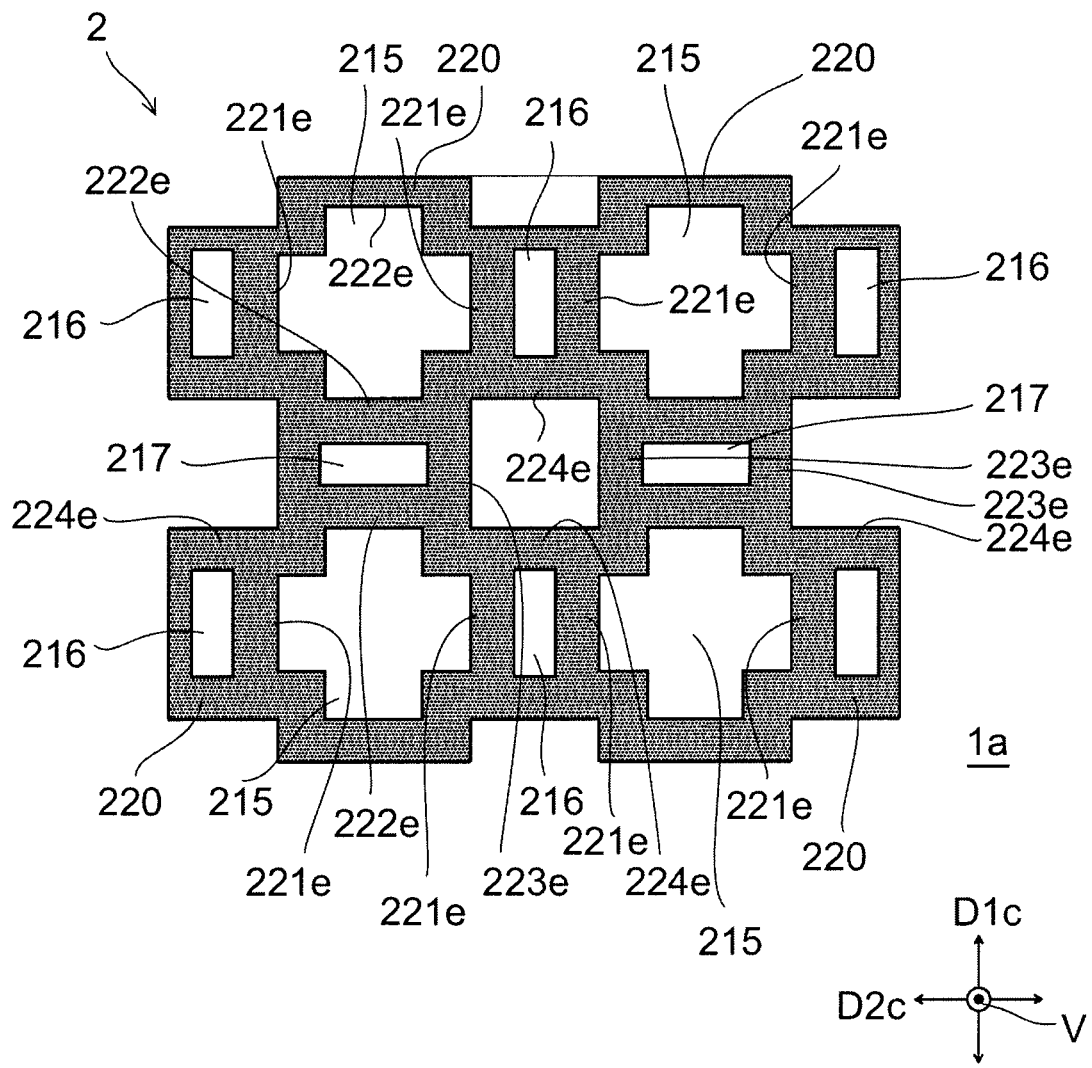

FIG. 6 is a schematic plan view illustrating another metal layer.

In the metal layer 2 illustrated in FIG. 6, dodecagonal openings 215, tetragonal (rectangular) openings 216 and 217, and tetragonal (square) openings 218 are combined by a plurality of straight line parts 220 along two different directions. Straight line parts 221e and 223e along direction D1c, and straight line parts 222e and 224e along direction D2b, are included by the plurality of straight line parts 220.

The plurality of dodecagonal openings 215 are arranged in a matrix along the major surface 1a. Each of the plurality of tetragonal openings 216 is arranged between two of the plurality of openings 215, neighboring in direction D2c. The shape of the openings 216 is rectangular with longer side in direction D2c. The plurality of openings 216 are also arranged in a matrix along the major surface 1a.

Each of the plurality of openings 217 is arranged between two of the plurality of openings 215, neighboring in direction D2c. The shape of the openings 217 is rectangular with longer side in direction D2c. The plurality of openings 217 are also arranged in a matrix along the major surface 1a.

Each of the plurality of openings 218 is arranged between two of the plurality of openings 215 neighboring in direction D1c and between two of the plurality of openings 215 neighboring in direction D2c. The plurality of openings 218 are also arranged in a matrix along the major surface 1a.

In the metal layer 2 shown in FIG. 6, lengths of the straight line parts 221e, 222e, 223e, and 224e are not more than the wavelength of visible light.

As mentioned above, various kinds of forms can be considered for the metal layer 2.

For the light-transmitting metal electrode according to the embodiment, the occupancy of the metal nanowire 22 is more than 20%, and not more than 80%. It is not preferable for the occupancy of the metal nanowire 22 to be not more than 20%, because the resistivity becomes comparable to the resistivity of a transparent conductive oxide. On the other hand, it is not preferable for the occupancy of the metal nanowire 22 to be more than 80%, because the metallic reflection increases to reduce the transparency.

In the light-transmitting metal electrode, plurality of polygonal openings 21 are formed by the plurality of straight line part 220. Thus, for the light-transmitting metal electrode, high transparency can be achieved in a broad wavelength range. Furthermore, since the occupancy of the metal nanowire 22 is more than 20% and not more than 80%, the light-transmitting metal electrode can be a transparent electrode with resistance lower than the resistance of an electrode made of a transparent conductive oxide.

Figure 7:
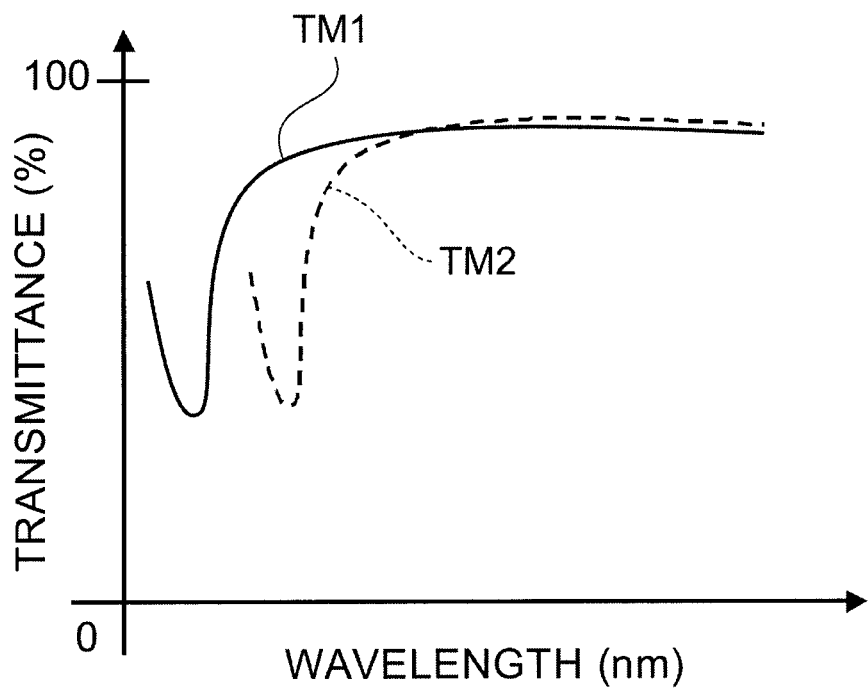
FIG. 7 is a view showing an example of the transmission spectrum of a straight line part.

FIG. 7 is a view showing an example of the transmission spectrum of a straight line part.

In FIG. 7, the horizontal axis shows the wavelength of light and the vertical axis shows the transmittance of light.

In FIG. 7, transmission-spectrum TM1 in a case that light in a polarization direction vertical to a direction along which the straight line parts 220 extend (vertically polarized light) enters and transmission-spectrum TM2 in a case of entering polarized light horizontal to the direction (horizontally polarized light) are shown.

If light in a polarization direction vertical to the direction along which the straight line parts 220 extend enters, free electrons in the straight line parts 220 will oscillate while responding to the oscillating electric field of incident light. When the length of the straight line parts 220 is sufficiently longer than the wavelength, reflected light arises by oscillation of the free electrons. Thereby, the straight line parts 220 become opaque.

On the other hand, if the length of the straight line parts 220 becomes comparable to the wavelength, oscillation of the free electrons by the oscillating electric field will be interrupted by the potential barrier of an interface between metal and air. As a result, surface charges are generated at the interface between metal and air. The surface charges generate an electric field of which direction is opposite to the direction of the oscillating electric field (anti-electric field), thereby, resonance between the anti-electric field and the incident electric field (localized surface plasmon resonance) takes place at a specific wavelength.

The wavelength at which localized surface plasmon resonance takes place depends on the amount of surface charges appearing on the surface of the straight line parts 220 and the distance of the free electrons moving in the straight line parts 220. Therefore, the wavelength at which localized surface plasmon resonance takes place, changes depending on the length of the straight line parts 220 along the polarization direction of incident light, the permittivity of the straight line parts 220, and the permittivity of a medium surrounding the straight line parts 220.

As shown in FIG. 7, large dips are observed in transmission-spectra TM1 and TM2 of the straight line part 220, at a specific wavelength. This is because generation of localized surface plasmon resonance causes reflection and absorption of light to occur in the straight line part 220. On the other hand, it can be seen that high transmittance is shown at a wavelength region where the wavelength is larger than the wavelength at which the dip takes place. This is because, as the wavelength of incident light becomes larger (the frequency of incident light becomes lower), oscillation of free electrons is structurally interrupted by the side wall of the straight line part 220 to suppress reflection and enable free electrons in the straight line part 220 to follow the incident electric field of light, and thereby, localized surface plasmon resonance is also not generated.

As a result, as shown in FIG. 7, in the transmission spectrum in case that light in a polarization direction vertical to a direction along which the straight line part 220 extends, large dip is generated by localized surface plasmon resonance at a short wavelength side, and the straight line part 220 will behave as a transparent material with high transmittance in a broad wavelength range at the longer wavelength side.

On the other hand, when light in a polarization direction horizontal to the direction along which the straight line part 220 extends, enters, free electrons will be oscillated horizontally by the incident electric field. As a result, surface charges are generated at the end of the straight line part 220, and localized surface plasmon resonance takes place like the case of vertically polarized light.

For horizontally polarized light, since the length of the straight line part 220 along the polarization direction is longer than the case of vertically polarized light, the wavelength at which localized surface plasmon resonance takes place, becomes longer than the corresponding wavelength for the vertically polarized light. At the longer wavelength side than the wavelength at which localized surface plasmon resonance takes place, high transmittance is shown like the case of vertically polarized light. As a result, in the transmission spectrum of horizontally polarized light as well as the case of vertically polarized light, a dip is generated by localized plasmon resonance in a short wavelength side, and the straight line part 220 will behave as a transparent material at the longer wavelength side.

Inventors, by connecting the plurality of straight line parts 220 with such optical properties in two dimensional directions (at least two directions) to constitute a light-transmitting metal electrode with polygonal openings 21, found that the light-transmitting metal electrode exhibits low resistance, and high transparency in a broad wavelength range.

The optical properties of a light-transmitting metal electrode are explained from the optical characteristics of the straight line part 220. The light-transmitting metal electrode has polygonal openings 21 constituted by connecting the plurality of straight line parts 220. For this reason, oscillation of free electrons in the straight line part 220 caused by an incident electric field is structurally interrupted for light polarized in any direction. As a result, in the transmission spectrum of the light-transmitting metal electrode, a loss generated by localized plasmon resonance due to vertical polarization to the straight line part 220 and a loss generated by localized plasmon resonance due to horizontal polarization to the straight line part 220, and high transmittance is exhibited in a wavelength range at the longer wavelength range side with respect to the wavelengths at which these losses take place.

As such, the light-transmitting metal electrode according to the embodiment will exhibit high transparency in a broad wavelength range.

Figure 8:
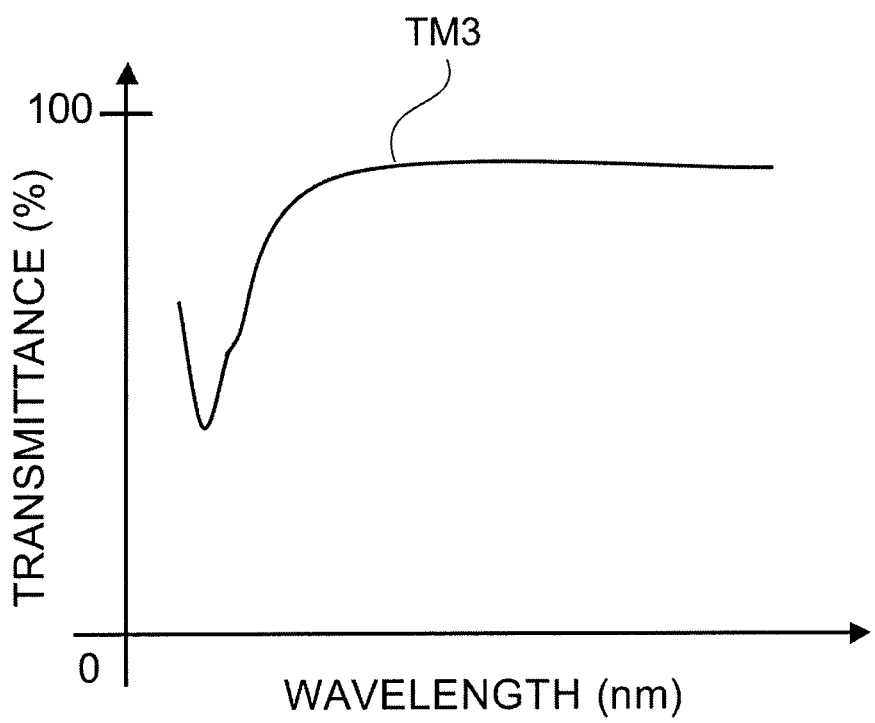
FIG. 8 is a view showing an example of the transmission spectrum of the light-transmitting metal electrode.

FIG. 8 is a view showing an example of the transmission spectrum of the light-transmitting metal electrode according to the embodiment.

Like transmission-spectrum TM3 shown in FIG. 8, in the transmission spectrum of the light-transmitting metal electrode, high transparency can be achieved at the side of a wavelength longer than the wavelengths at which localized plasmon resonance takes place. On the other hand, near the wavelength at which localized plasmon resonance takes place, losses due to reflection and absorption caused by the metal nanowire 22 are generated, and thereby, transmittance decreases.

The wavelength for the straight line part 220, at which localized surface plasmon resonance takes place, depends on the length of the straight line part 220. That is, if the length of the straight line part 220 becomes longer, the wavelength at which localized plasmon resonance takes place will be shifted to the longer wavelength side. In order to achieve high transparency in a broad wavelength range of the visible light region, it is preferable to shift further the wavelength at which localized plasmon resonance takes place to a short wavelength side.

Therefore, the maximum length of the straight line part 220 in the light-transmitting metal electrode is made not more than the wavelength of visible light. As such, in the light-transmitting metal electrode, high transmittance can be achieved in a broad range of visible light.

When the metal electrode having openings sufficiently larger than a wavelength, if the occupancy of the metal nanowire part is made larger, transmittance will be reduced relative to the occupancy. This is due to reflection of light occurring in the metal part. On the other hand, the light transmission principle of the light-transmitting metal electrode according to the embodiment is based on the structure including the polygonal openings 21 made by connecting the straight line parts 220 with a length shorter than the wavelength of visible light. Thus, oscillation of the free electrons in the metal nanowire part is structurally interrupted. Thereby, even if occupancy of the metal nanowire 22 becomes high, reduction in transmittance is suppressed.

Here, although it is possible to achieve high transparency even if the occupancy of the metal nanowire 22 becomes not more than 20%, if the occupancy of the metal nanowire 22 decreases, the resistivity will increase. On the other hand, if the occupancy of the metal nanowire 22 becomes not less than 80%, reflection caused by the metal nanowire 22 will be larger, thereby transparency will be reduced. Therefore, it is preferable for the occupancy of the metal part to be more than 20% and not more than 80%.

The method for manufacturing the light-transmitting metal electrode is not limited especially, as long as the structure required by the invention is satisfied. The maximum length L of the straight line part 220 in the metal layer 2 of the invention is not less than the wavelength of visible light, and the size of the opening 21 is also comparable to the wavelength.

FIGS. 9A to 9D are schematic cross-sectional views showing an example of methods for manufacturing the light-transmitting metal electrode.

Figure 9A:
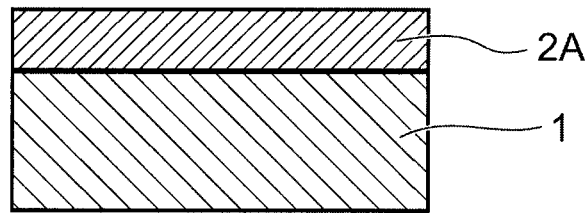
FIGS. 9A to 9D are schematic cross-sectional views showing an example of methods for manufacturing the light-transmitting metal electrode.

First, as shown in FIG. 9A, a metal material layer 2A is formed on a member 1. The metal material layer 2A may be formed using widely generalized thin film deposition processes. For example, a resistive thermal evaporation method, an electron-beam evaporation method, a laser deposition method, a sputtering method, a CVD (Chemical Vapor Deposition) method, and an MBE (Molecular Beam Epitaxy) method, are included.

Figure 9B:
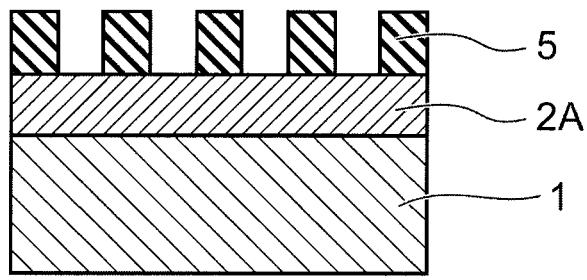

Next, as shown in FIG. 9B, a patterned layer 5 corresponding to the shape of the metal nanowire 22 is formed on the metal material layer 2A. The patterned layer 5 is formed using methods, such as, an optical lithography method, an electron-beam lithography method, a nanoimprint method, a soft imprint method, a block polymer lithography method, a colloidal lithography method, a scanning probe method.

Figure 9C:
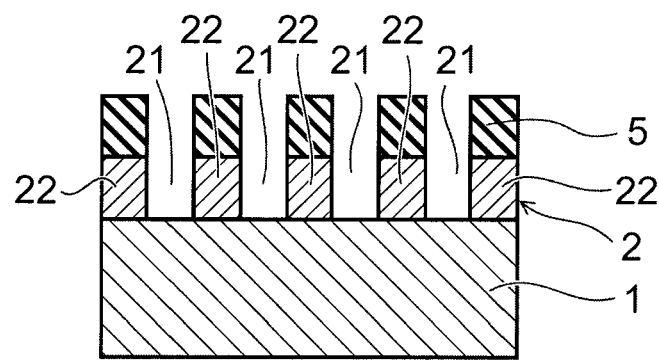

Next, as shown in FIG. 9C, a pattern is formed on the metal material layer 2A using the patterned layer 5 as a mask. The pattern is formed using, for example, a dry etching method, an ion milling method, and a focused ion beam method. Openings 21 are formed in the metal layer 2 by etching the metal material layer 2A from an opening of the patterned layer 5. The metal nanowire 22 remains on parts masked with the patterned layer 5.

Figure 9D:
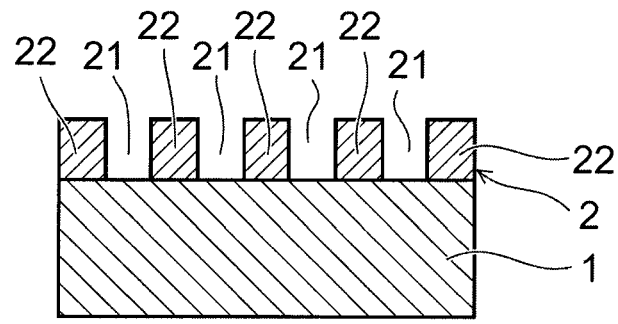

Then, as shown in FIG. 9D, by removing the patterned layer 5, the metal layer (light-transmitting metal electrode) 2 is completed.

In the embodiment, since the metal nanowire 22 is used as a component, when the metal layer 2 is fabricated by electron beam drawing, there is an effect to shorten drawing time.

In this case, although the metal material layer 2A is formed on the member 1 at a first process, the light-transmitting metal electrode may be fabricated using a lift-off method or a plating method including processes of forming the patterned layer 5 on the member 1, then, forming the metal material layer 2A, and removing the patterned layer 5 and the metal on the patterned layer 5.

The structure of the light-transmitting metal electrode obtained by such a method can be confirmed using a common scanning electron microscope. For example, an electron microscope image containing one to about ten openings 21 in a scanning area, is observed. The maximum length of the straight line part 220 can be measured from the obtained image. Fluctuation in a straight line of the side wall 220w of the straight line part 220 and fluctuation in an intersection point of the straight line part 220, can also measured from the image. Subsequently, an electron microscope image containing about 50 openings 21 is observed. The occupancy of the metal nanowire 22 can be obtained by analyzing the obtained image and binarizing it into the metal nanowire 22 and the openings 21.

Figure 10A:
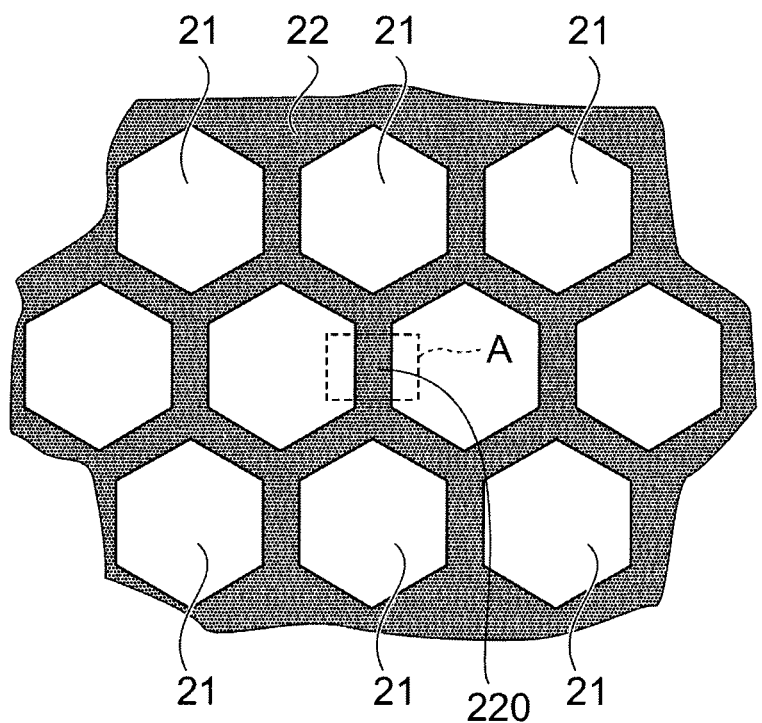
FIGS. 10A and 10B are schematic views illustrating an observation image by an electron microscope.
Figure 10B:
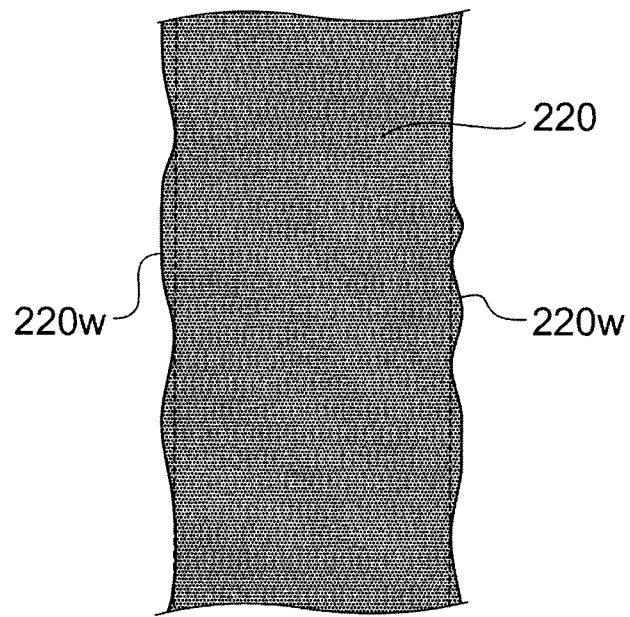

FIGS. 10A and 10B are schematic views illustrating an observation image by an electron microscope.

FIG. 10B is an enlarged view of section A shown in FIG. 10A. It can be seen that the side wall 220w of the straight line part 220 does not form a perfect straight line. This is due to fluctuation from a designed value during micro-fabrication.

For example, when the patterned layer 5 is formed using optical lithography, as a material forming the patterned layer 5, an organic polymer, such as, resist used in a usual semiconductor process, is used. In optical lithography, if pattern formation is carried out to the patterned layer 5 using a photomask, fluctuation originating from the dimension of the organic polymer will occur on the side wall of the patterned layer 5. Due to the straight line fluctuation of the patterned layer, similar fluctuation will occur in the metal material layer 2A. However, as a result of inventors' investigation, even if such fluctuation occurs, the action and the effect of the embodiment will not be vitiated as long as fluctuation from the designed value is within, for example, ±30%. The reason of this is in that although the fluctuation will expand the half band width of dip of a transmission spectrum, at the wavelength at which localized surface plasmon resonance takes place, the transparency at the longer wavelength side with respect to this wavelength range, will not be affected.

Figure 11A:
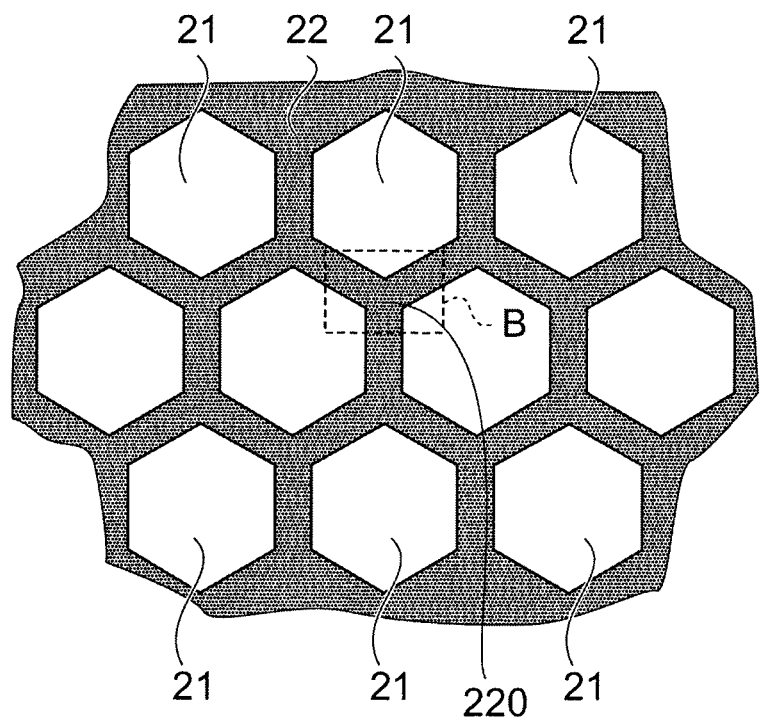
FIGS. 11A to 11B are schematic views illustrating another observation image by the electron microscope.
Figure 11B:
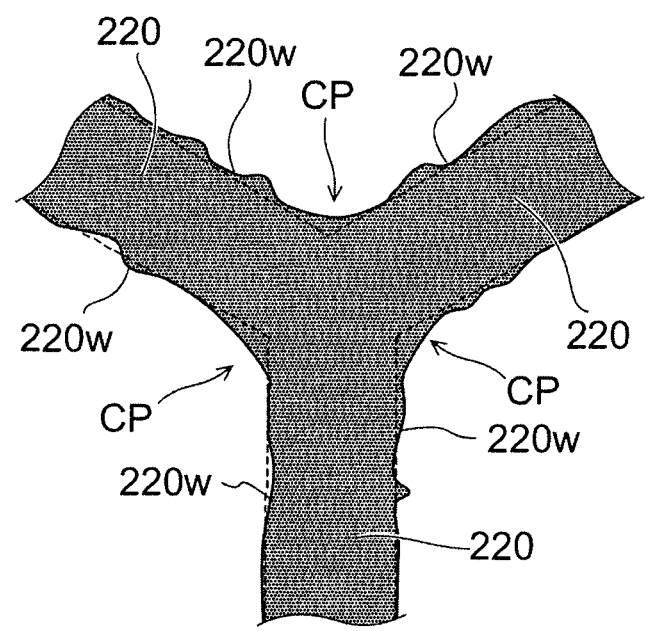

FIGS. 11A to 11B are schematic views illustrating another observation image by the electron microscope.

FIG. 11B is an enlarged view of section B shown in FIG. 11A. That is, in FIG. 11B, the observation image of the intersection portion (section B in FIG. 11A) where three straight line parts 220 are overlapped, is shown.

In the intersection portion shown in FIG. 11, it can be seen that angle CP where the side walls 220w crosses did not make a perfect angle, instead, it is roundish. Similarly to the former case, this case is also derived from fluctuation. The reason is in that when optical lithography is used, light is broadened by diffraction at the pattern edge of a photomask. However, as long as the fluctuation from a design value is within, for example, ±30%, the action and the effect of the embodiment will not be vitiated.

The light-transmitting metal electrode has a resistance lower than the resistance of the transparent electrode using an transparent conducting oxide, and has high transparency in a broad wavelength range. Therefore, it is applied for optical components, such as, a touch panel; photoelectric conversion elements, such as, a semiconductor light emitting element, a solar cell, and a photodetector; display elements, such as, a liquid crystal display, and organic electroluminescence element; and various kinds of other instruments.

Second Embodiment

Next, an electronic apparatus according to a second embodiment will be described.

The above described light-transmitting metal electrode is applied for various kinds of electronic apparatuses.

The electronic apparatus includes a structure body having a major surface. The light-transmitting metal electrode is provided on the major surface of the structure body. Electric charges are supplied to the structure body through a metal layer 2 which is a light-transmitting metal electrode.

An example of application for a specific electronic apparatus will now be described.

Figure 12:
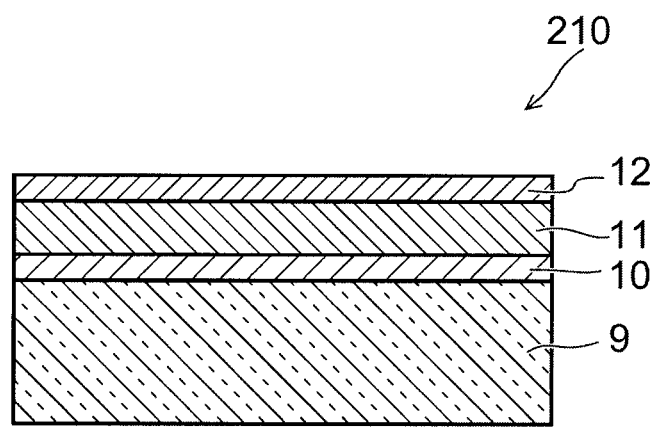
FIG. 12 is a schematic cross-sectional view illustrating the configuration of an organic electroluminescence element.

FIG. 12 is a schematic cross-sectional view illustrating the configuration of an organic electroluminescence element.

In FIG. 12, the structure of a bottom-emission type element is shown. As shown in FIG. 12, the organic electroluminescence element (hereinafter, simply referred to as an "organic EL device") 210 includes a substrate 9, an electrode layer 10 provided on the substrate 9, a light emitting layer 11 provided on the electrode layer 10, and a counter electrode 12 provided on the light emitting layer 11. The structure body includes a stacked structure of, for example, the substrate 9, the electrode layer 10, and the light emitting layer 11. In the organic EL device 210, for example, the light-transmitting metal electrode according to the embodiment is applied for as the electrode layer 10.

The substrate 9 has, for example, transparency. The light emitting layer 11 is an example of an optical layer, and includes at least one or more layers of an organic luminescent material. The light emitting layer 11 emits light according to electric charges supplied from the metal layer 2 of the light-transmitting metal electrode which is the electrode layer 10. That is, in an organic EL device 210, electrons and positive holes injected in the light emitting layer 11 from the electrode layer 10 and the counter electrode 12, recombine in the light emitting layer 11 and emit light. Emitted light permeates through the electrode layer 10 which is the light-transmitting metal electrode, and it is emitted outside.

Although the structure of the bottom-emission type element is shown in FIG. 12, the structure of a top-emission type element may be used. The light-transmitting metal electrode is provided at the side where emission light is emitted to the light emitting layer 11 of the organic EL device 210. In the organic EL device 210, the light-transmitting metal electrode may be used for the counter electrode 120.

The organic EL device 210 is also applicable to devices, such as, a display device composed of an array of a plurality of basic elements by using the element structure shown in FIG. 12 as the basic element, and an illuminating device composed of a large area basic element. When a generally used transparent conductive oxide is used for the electrode layer 10, the fluctuation in luminescence intensity may occur due to voltage drop caused by the resistance of the electrode layer 10. In particular, for a large area device like the illuminating device, this problem is remarkable. By using a light-transmitting metal electrode of which resistance is lower than the resistance of an transparent conductive oxide, the fluctuation in luminescence intensity is improved without vitiating transparency.

Figure 13:
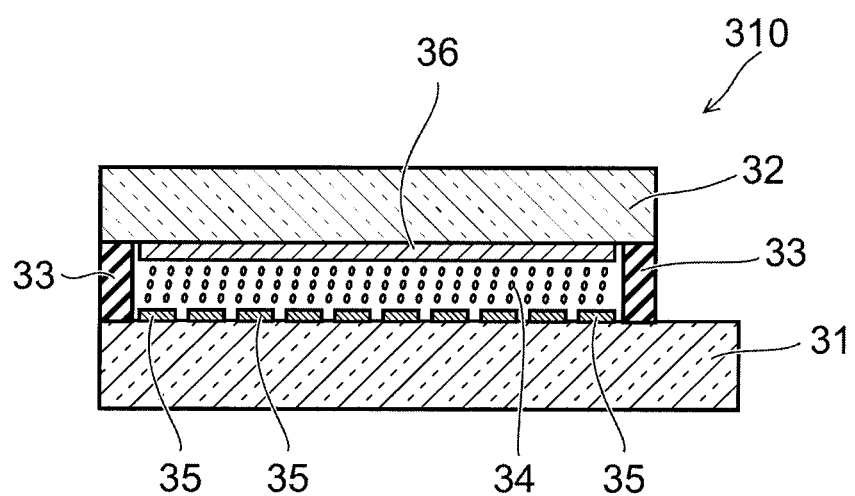
FIG. 13 is a schematic cross-sectional view illustrating the configuration of a liquid crystal display device.

FIG. 13 is a schematic cross-sectional view illustrating the configuration of a liquid crystal display device.

As shown in FIG. 13, the liquid crystal display device 310 includes a drive substrate 31, a counter substrate 32, a seal part 33, a liquid crystal layer 34, a pixel electrode 35, and a counter electrode 36. The structure body includes, for example, the drive substrate 31, a seal part 33, a liquid crystal layer 34, and a pixel electrode 35. In the liquid crystal display device 310, the light-transmitting metal electrode according to the embodiment is applied for the counter electrode 36.

In the drive substrate 31, the pixel electrode 35 is provided to each pixel. Drive elements (not shown), such as TFT (Thin Film Transistor), are connected to the pixel electrode 35. The pixel electrode 35 is controlled by a drive element. Electric charges are supplied into the pixel electrode 35 of the structure through the counter electrode 36 and the drive element. In the pixel electrode 35, a voltage according to the charges is generated. The voltage between the pixel electrode 35 and the counter electrode 36 is applied to the liquid crystal layer 34, thereby, optical properties of the liquid crystal layer 34 are controlled.

The drive substrate 31 is adhered to the counter substrate 32 through the seal part 33. The counter electrode 36 is provided with the counter substrate 32. The liquid crystal layer 34 is provided between the drive substrate 31 and the counter substrate 32.

The liquid crystal layer 34 is an example of optical layers of which optical properties including at least any one of current-birefringence, optical activity, scattering property, diffractive property, and absorption property change depending on a voltage according to electric charges. According to the change of the optical properties of the liquid crystal layer 34, light transmittance of the liquid crystal layer 34 changes for every pixel.

Figure 14:
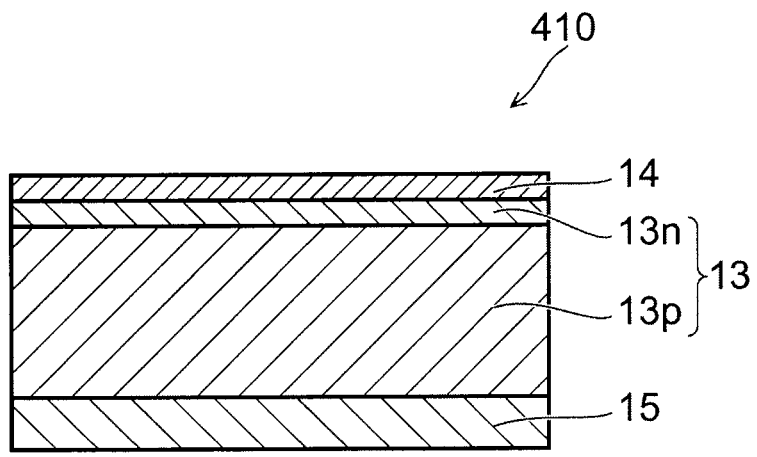
FIG. 14 is a schematic cross-sectional view illustrating the configuration of a solar cell.

FIG. 14 is a schematic cross-sectional view illustrating the configuration of a solar cell.

As shown in FIG. 14, the solar cell 410 includes a silicon substrate 13 on which at least not less than one p-n junction is formed, an electrode layer 14 provided at one side (light radiation surface side) of the silicon substrate 13, and a counter electrode 15 provide at the other side (a side opposite to the light radiation surface) of the silicon substrate 13. The light-transmitting metal electrode according to the embodiment is applied for the electrode layer 14.

In the example of the solar cell 410 shown in FIG. 14, the silicon substrate 13 is provided with an n-layer 13n and a p-layer 13p. The silicon substrate 13 is an example of structure bodies and includes a photoelectric conversion layer (for example, a layer containing a p-n junction) converting incident light into electric signals. For the solar cell 410, the side of the n-layer 13n of the silicon substrate 13 is used as a light radiation surface.

The sunlight permeated through the electrode layer 14 (a light-transmitting metal electrode) reaches to the silicon substrate 13. Carriers in the n-layer 13n and the p-layer 13p of the silicon substrate 13 excited by the sunlight permeated through the silicon substrate 13 are separated by an internal electric field, and collected by the electrode layer 14 and the counter electrode 15. In the light-transmitting metal electrode (the electrode layer 14), current containing electric signals converted in the photoelectric conversion layer of the silicon substrate 13 flows in the metal layer 2.

When the carrier diffusion length is long, like the solar cell using crystalline silicon, a comb-shaped electrode is used as an electrode at the light radiation surface side (electrode layer 14). At this time, light radiated on the comb-shaped electrode is shaded and becomes as a reflectance loss. Reduction of such a reflectance loss is achieved using the light-transmitting metal electrode according to the embodiment.

On the other hand, for a thin film silicon solar cell, an amorphous silicon thin film is used as a power generation layer. Since the carrier diffusion length of amorphous silicon is shorter than the carrier diffusion length of crystalline silicon, the comb-shaped electrode is difficult to be used. Therefore, an electrode of which entire radiation surface has optical transparency (for example, an transparent conductive oxide) is used.

Since resistivity of the transparent conductive oxide electrode is higher than the resistivity of a metal material, efficiency of the solar cell decreases due to the resistance loss in the transparent conductive oxide electrode. If the substrate size of the solar cell becomes larger, such decrease in efficiency will be remarkable. If the light-transmitting metal electrode according to the embodiment is used, the resistance loss will be reduced and the conversion efficiency will be improved.

Figure 15:
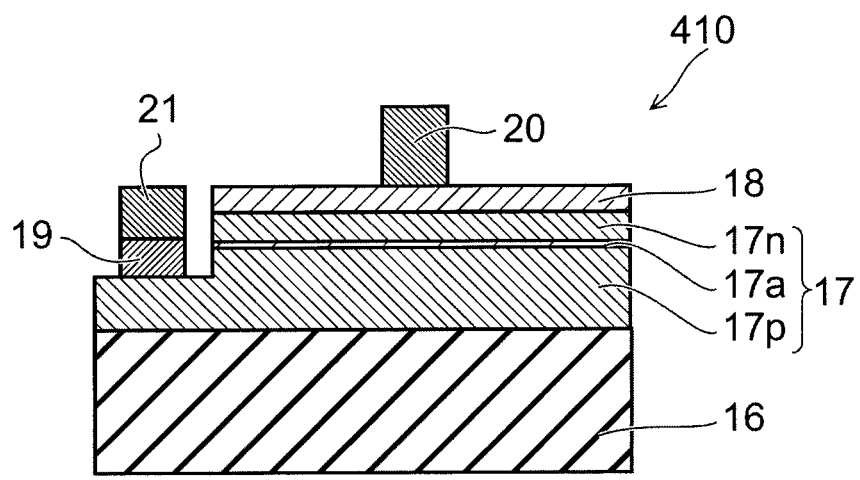
FIG. 15 is a schematic cross-sectional view illustrating the configuration of a semiconductor light emitting element.

FIG. 15 is a schematic cross-sectional view illustrating the configuration of a semiconductor light emitting element.

In FIG. 15, the structure of a face-up type semiconductor light emitting element is illustrated.

As shown in FIG. 15, the semiconductor light emitting device 510 includes a substrate 16, a semiconductor layer 17 provided on the substrate 16, an n-side electrode 18 provided on the semiconductor layer 17, a p-side electrode 19 provided on the semiconductor layer 17, a first pad electrode 20n provided on the n-side electrode 18, and a second pad electrode 20p provided on the p-side electrode 19. The structure body includes, for example, the substrate 16 and the semiconductor layer 17. The light-transmitting metal electrode according to the embodiment is applied for the n-side electrode 18.

The semiconductor layer 17 contains, for example, a p-type semiconductor layer 17p, an n-type semiconductor layer 17n, and a light emitting layer 17a. The light emitting layer 17a is provided between the p-type semiconductor layer 17p and the n-type semiconductor layer 17n. The light emitting layer 17a emits light according to electric charges supplied from the electrode layer 2 of the light-transmitting metal electrode (the n-side electrode 18). That is, electrons and positive holes injected into the semiconductor layer 17 recombine to emit light, which permeates through the n-side electrode 18 (the light-transmitting metal electrode) and is emitted outside the device.

In order to increase luminescence intensity of the semiconductor light emitting element 510, it is effective to increase injection current. However, the current-luminance property of the semiconductor light emitting element to which the transparent conductive oxide electrode is applied as the n-side electrode 18 has a peak at a certain current value, thereby, even if current larger than the value is flown in the semiconductor light emitting element, the luminance will decrease. The reason is in that since the resistivity of the transparent conductive oxide electrode is high, current injection is difficult to be uniformly carried out, leading to difficulty of uniform light emission. By using the light-transmitting metal electrode with resistivity lower than the resistivity of the transparent conductive oxide electrode as the n-side electrode 18, reduction of the luminance due to current concentration is suppressed, enabling to provide a high luminance semiconductor light emitting element 510. Further, even for a large area semiconductor light emitting element 510, uniform light-emitting property can be achieved.

Third Embodiment

Next, an light emitting device according to a third embodiment will be described.

The light-transmitting metal electrode described above is applied to various light emitting devices.

An light emitting device includes an optical member having a light-transmitting portion and a major surface. The light-transmitting metal electrode is provided on the major surface of the optical member.

An example of application for the light emitting device will now be described.

Figure 16:
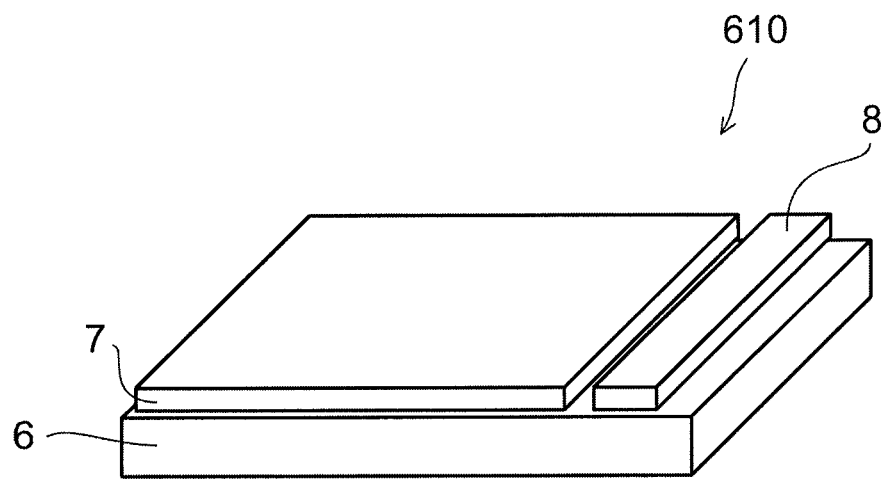
FIG. 16 is a schematic perspective view illustrating the configuration of a touch panel.

FIG. 16 is a schematic perspective view illustrating the configuration of a touch panel.

As shown in FIG. 16, the touch panel 610 includes a substrate 6 (an example of an optical member) and an electrode layer 7 provided on the substrate 6. The light-transmitting metal electrode according to the embodiment is applied for the electrode layer 7. In the touch panel 610, the substrate 6 is an example of an optical member. A drive circuit 8 is formed in the substrate 6. The touch panel 610 may include a counter electrode (not shown) facing to and separated from the electrode layer 7. The mode of the touch panel 610 may be either resistance change type or electrostatic capacity type. In contrast to a case of using an transparent conductive oxide as the electrode layer 7, by using the light-transmitting metal electrode as the electrode layer 7, contact sensitivity is improved without vitiating transparency.

Figure 17:
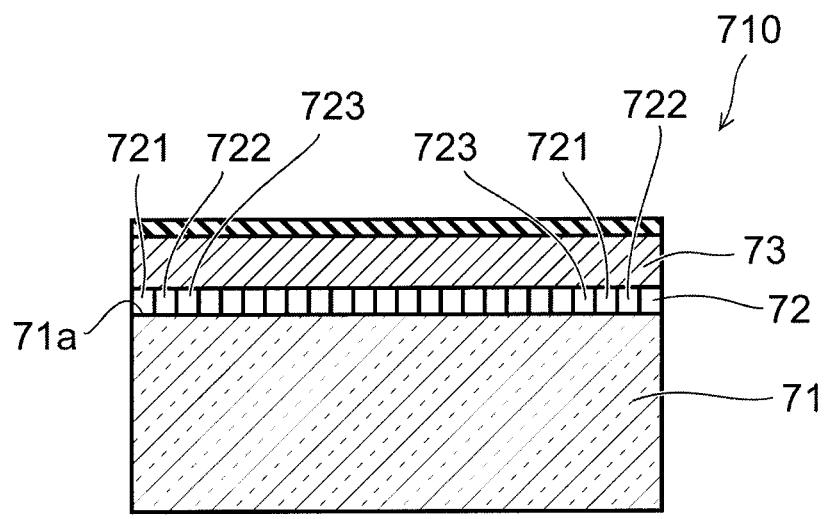
FIG. 17 is a schematic cross-sectional view illustrating the configuration of a color filter.

FIG. 17 is a schematic cross-sectional view illustrating the configuration of a color filter.

The color filter 710 includes a color layer 72 in which light transmittance of a specific wavelength band is higher than the light transmittance of the other wavelength band. The color layer is one example of optical members. The color layer is formed on, for example, the major surface 71a of a substrate 71. The color layer 72 is provided with an electrode layer 73. The light-transmitting metal electrode according to the embodiment is applied for the electrode layer 73.

The color layer 72 includes, for example, a first region 721 transmitting light in a first wavelength band, a second region 722 apposed with the first region 721 in a plane parallel to the major surface 71a and transmitting light in a second wavelength band different from the first wavelength band, and a third region 723 apposed with the first region 721 and the second region 722 in a plane parallel to the major surface 71a and transmitting light in a third wavelength band different from the first wavelength band and the second wavelength band.

A color filter 710 is used as, for example, a counter side member of a liquid crystal display. For example, the substrate 71 of the color filter 710 is used as the counter substrate 32 shown in FIG. 13, and the electrode layer 73 is used as the counter electrode 36 shown in FIG. 13.

In the color filter 710, a covering layer 74 made of material different from the metal layer 2 may be provided on the metal layer 2 of the light-transmitting metal electrode (the electrode layer 73). When using the color filter 710 as the counter side member, the covering layer 74 is, for example, an oriented film in which orientation of liquid crystal of the liquid crystal layer 34 is aligned.

FIRST EXAMPLE

First example is a specific example of a light-transmitting metal electrode using silver (Ag) with hexagonal openings 21.

On a cleaned quartz substrate (AQ, made by Asahi Glass Co., Ltd.), AgCu (Ag73%, Cu27%) was deposited at a thickness of 30 nm by a vacuum deposition method. After subjecting the substrate to heat treatment at 300° C. in a nitrogen atmosphere, SiO was vapor-deposited on the substrate at a thickness of 30 nm. Then, resist (THMR-ip3250 made by TOKYO OHKA KOGYO CO., LTD.) was applied on the substrate, and the substrate was subjected to thermal nanoimprint at 120° C.

The mold used for nanoimprint includes a recessed portion for forming straight line parts 220, and a regular hexagonal protrusion part for forming openings 21. A plurality of protrusion parts were periodically formed on a support substrate. Maximum length of the recessed part was 200 nm. The occupancy of the protrusion parts was 60%. A pattern of the mold was transferred to resist.

After removing the mold, it was confirmed that a structure of the reverse pattern of the mold was formed in the resist. Then, a residual resist film was removed using a reactive ion etching apparatus, then, SiO was etched using the resist as a mask. Residual resist was dissolved with acetone.

Then, AgCu was etched by an ion milling apparatus using SiO as the mask. Residual SiO was dissolved by hydrofluoric acid. The surface of the resultant structure was observed by a scanning electron microscope. As a result, the maximum length of the straight line part 220 was 200 nm. Arrangement of the hexagonal openings 21 formed with the straight line parts 220 was periodic. The area ratio of the metal nanowire 22 was about 40%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 400 nm, and high transmittance of 85% to 75% was exhibited at the longer wavelength side with respect to the wavelength. Further, as a result of measuring sheet resistance, it was 0.8 Ω/□.

SECOND EXAMPLE

Second example is a specific example of a light-transmitting metal electrode using gold (Au) having hexagonal openings 21.

On a cleaned quartz substrate (AQ, made by Asahi Glass Co., Ltd.), Cr was deposited at a thickness of 0.5 nm. Subsequently, Au was deposited at a thickness of 30 nm by a vacuum deposition method. After subjecting the substrate to heat treatment at 300° C. in a nitrogen atmosphere, SiO was vapor-deposited on the substrate at a thickness of 30 nm. Then, resist (THMR-ip3250, made by TOKYO OHKA KOGYO CO., LTD.) was applied on the substrate, and the substrate was subjected to thermal nanoimprint at 120° C.

The mold used for nanoimprint is the same one as used in the first example. A pattern of the mold was transferred to resist. After removing the mold, it was confirmed that a structure of the reverse pattern of the mold was formed in the resist. Then, a residual resist film was removed using a reactive ion etching apparatus, then, SiO was etched using the resist as a mask. Residual resist was dissolved with acetone.

Then, Au was etched by an ion milling apparatus using SiO as the mask. Residual SiO was dissolved by hydrofluoric acid. The surface of the resultant structure was observed by a scanning electron microscope. As a result, the maximum length of the straight line part 220 was 200 nm. Arrangement of the hexagonal openings 21 formed with the straight line parts 220 was periodic. The area ratio of the metal nanowire 22 was about 40%.

By entering light vertically to the light-transmitting metal electrode, transmittance with respect to the wavelength of the incident light was measured. Specifically, the transmission spectrum at vertical incidence was measured in a wavelength range of 200 nm to 1500 nm. As a result, a large dip is generated at a wavelength of 650 nm, and high transmittance of 85% to 75% was exhibited at the longer wavelength side with respect to the wavelength. Further, as a result of measuring sheet resistance, it was 0.9 Ω/□.

THIRD EXAMPLE

Third example is a specific example of a light-transmitting metal electrode using aluminum (Al) having hexagonal openings 21.

On a cleaned quartz substrate (AQ, made by Asahi Glass Co., Ltd.), Al was deposited at a thickness of 30 nm by a vacuum deposition method. The substrate was subjected to heat treatment at 300° C. in a nitrogen atmosphere. Then, resist (THMR-ip3250, made by TOKYO OHKA KOGYO CO., LTD.) was applied on the substrate, and the substrate was subjected to thermal nanoimprint at 120° C.

The mold used for nanoimprint is the same one as used in the first example. A pattern of the mold was transferred to resist. After removing the mold, it was confirmed that a structure of the reverse pattern of the mold was formed in the resist. Then, a residual resist film was removed using a reactive ion etching apparatus, then, Al was etched using the resist as a mask. Residual resist was dissolved with acetone.

The surface of the resultant structure was observed by a scanning electron microscope. As a result, the maximum length of the straight line part 220 was 200 nm. Arrangement of the hexagonal openings 21 formed with the straight line parts 220 was periodic. The area ratio of the metal nanowire 22 was about 40%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 280 nm, and high transmittance of 80% to 70% was exhibited at the longer wavelength side with respect to the wavelength. Further, as a result of measuring sheet resistance, it was 1.1 Ω/□.

FOURTH EXAMPLE

Fourth example is a specific example of a light-transmitting metal electrode using Ag having tetragonal openings 212 and octagonal openings 211.

In the same way as the first example, a substrate on which AgCu and SiO were deposited, was prepared. Then, resist (THMR-ip3250, made by TOKYO OHKA KOGYO CO., LTD.) was applied on the substrate, and the substrate was subjected to thermal nanoimprint at 120° C.

The mold used for nanoimprint includes a recessed portion for forming straight line parts 220, a regular octagonal protrusion part for forming openings 211 and a square protrusion part for forming openings 212. A plurality of square protrusion parts and a plurality of regular octagonal protrusion parts were periodically formed on a support substrate. Maximum length of the recessed part was 200 nm. The occupancy of the protrusion parts was 70%. A pattern of the mold was transferred to resist.

After removing the mold, it was confirmed that a structure of the reverse pattern of the mold was formed in the resist. Then, AgCu was etched by the same way as the first example. The surface of the resultant structure was observed by a scanning electron microscope. As a result, the maximum length of the straight line part 220 was 200 nm. Arrangement of the tetragonal openings 21 and octagonal openings 21 formed with the straight line parts 220 was periodic. The area ratio of the metal nanowire 22 was about 30%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 390 nm, and high transmittance of 85% to 80% was exhibited at the longer wavelength side with respect to the wavelength. Further, as a result of measuring sheet resistance, it was 0.9 Ω/□.

FIFTH EXAMPLE

Fifth example is a specific example of a light-transmitting metal electrode using Ag having tetragonal openings and dodecagonal openings.

In the same way as the first example, a substrate on which AgCu and SiO were deposited, was prepared. Then, resist (THMR-ip3250, made by TOKYO OHKA KOGYO CO., LTD.) was applied on the substrate, and the substrate was subjected to thermal nanoimprint at 120° C.

The mold used for nanoimprint includes a recessed portion for forming straight line parts 220, a dodecagonal protrusion part for forming openings 211 and a square protrusion part for forming openings 212. A plurality of dodecagonal protrusion parts and a plurality of square protrusion parts were periodically formed on a support substrate. Maximum length of the recessed part was 200 nm. The occupancy of the protrusion parts was 60%. A pattern of the mold was transferred to resist.

After removing the mold, it was confirmed that a structure of the reverse pattern of the mold was formed in the resist. Then, AgCu was etched by the same way as the first example. The surface of the resultant structure was observed by a scanning electron microscope. As a result, the maximum length of the straight line part 220 was 200 nm. Arrangement of the dodecagonal openings 213 and square openings 212 formed with the straight line parts 220 was periodic. The area ratio of the metal nanowire 22 was about 40%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 430 nm, and high transmittance of 85% to 75% was exhibited at the longer wavelength side with respect to the wavelength. Further, as a result of measuring sheet resistance, it was 0.8 Ω/□.

SIXTH EXAMPLE

Sixth example is a specific example of a light-transmitting metal electrode using Ag having rectangular openings and dodecagonal openings.

In the same way as the first example, a substrate on which AgCu and SiO were deposited, was prepared. Then, resist was applied on the substrate, and the substrate was subjected to thermal nanoimprint at 120° C.

The mold used for nanoimprint includes a recessed portion for forming straight line parts 220, a dodecagonal protrusion part for forming openings 211 and a protrusion part for forming openings 212. A plurality of dodecagonal protrusion parts and a plurality of rectangular protrusion parts were periodically formed on a support substrate. Maximum length of the recessed part extending in one direction was 200 nm. Maximum length of the recessed part extending in another direction was 150 nm. The occupancy of the protrusion parts was 55%. A pattern of the mold was transferred to resist.

After removing the mold, it was confirmed that a structure of the reverse pattern of the mold was formed in the resist. Then, AgCu was etched by the same way as the first example. The surface of the resultant structure was observed by a scanning electron microscope. As a result, the maximum length of the straight line part 220 extending in one direction was 200 nm, and the maximum length of the straight line part 220 extending in another direction was 150 nm Arrangement of the dodecagonal openings and rectangular openings formed with the straight line parts 220 was periodic. The area ratio of the metal nanowire 22 was about 45%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 450 nm, and high transmittance of 80% to 70% was exhibited at the longer wavelength side with respect to the wavelength. Further, as a result of measuring sheet resistance, it was 0.8 Ω/□.

FIRST COMPARATIVE EXAMPLE

First comparative example is a specific example of a light-transmitting metal electrode with a structure having regular hexagonal openings 21 in the same way as the first example, of which occupancy is 90%.

In the same way as the first example, a substrate on which AgCu and SiO were deposited, was prepared. Then, resist was applied on the substrate, and the substrate was subjected to thermal nanoimprint at 120° C.

The mold used for nanoimprint includes a recessed portion for forming straight line parts 220, and a regular hexagonal protrusion part for forming openings 211. A plurality of regular hexagonal protrusion parts were periodically formed on a support substrate. Maximum length of the recessed part was 200 nm. The occupancy of the protrusion parts was 90%. A pattern of the mold was transferred to resist.

After removing the mold, it was confirmed that a structure of the reverse pattern of the mold was formed in the resist. Then, a residual resist film was removed using a reactive ion etching apparatus, then, SiO was etched using the resist as a mask. Residual resist was dissolved with acetone.

Then, AgCu was etched by an ion milling apparatus using SiO as the mask. Residual SiO was dissolved by hydrofluoric acid. The surface of the resultant structure was observed by a scanning electron microscope. As a result, the maximum length of the straight line part 220 was 200 nm. Arrangement of the hexagonal openings 21 formed with the straight line parts 220 was periodic. The area ratio of the metal nanowire 22 was about 10%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 380 nm, and high transmittance of 85% to 75% was exhibited at the longer wavelength side with respect to the wavelength. Further, as a result of measuring sheet resistance, it was 2.5 Ω/□. For the light-transmitting metal electrode according to the first comparative example, resistance was exhibited to be higher than the resistance of the light-transmitting metal electrode according to the first example.

Second comparative example is a specific example of a light-transmitting metal electrode having circular openings 21.

In the same way as the first example, a substrate on which AgCu and SiO were deposited, was prepared. Then, resist was applied on the substrate, and the substrate was subjected to thermal nanoimprint at 120° C.

In the mold used for nanoimprint, circular protrusion parts with a diameter of 180 nm are arranged in a triangular lattice. The occupancy of the protrusion parts was 45%. A pattern of the mold was transferred to resist.

After removing the mold, it was confirmed that a structure of the reverse pattern of the mold was formed in the resist. Then, AuCu was etched in the same way as the first embodiment. The surface of the resultant structure was observed by a scanning electron microscope. As a result, circular protrusion parts with a diameter of 180 nm were formed in a triangular lattice. The area ratio of the metal nanowire 22 was 55%.

By entering light vertically to the light-transmitting metal electrode, transmittance with respect to the wavelength of the incident light was measured. Specifically, the transmission spectrum at vertical incidence was measured in a wavelength range of 200 nm to 1000 nm. As a result, a large dip is generated at a wavelength of 490 nm, and transmittance peak of 82% was generated at a wavelength of 560 nm. Thereby, the transmittance decreased at the longer wavelength side with respect to these wavelengths, and it was 32% at a wavelength of 1000 nm. For the light-transmitting metal electrode according to the second reference example, transparency in a broad wavelength range like the transparency for the light-transmitting metal electrode according to the first embodiment could not be achieved. Further, as a result of measuring sheet resistance, it was 0.7 Ω/□.

SEVENTH EXAMPLE

Seventh example is a specific example in which a light-transmitting metal electrode according to the embodiment is applied for lighting of an organic EL element.

The light-transmitting metal electrode according to the third embodiment was formed on a glass substrate. By applying PEDOT:PSS aqueous solution on the light-transmitting metal electrode, a positive-hole injection layer was formed. By depositing α-NPD thereon in a vacuum, a positive-hole transport layer was formed. Next, a blue light emitting layer in which FIrpic, a blue luminescent material, doped with CBP, was formed thereon by a co-evaporation method. Next, a red light emitting layer in which Btp2Ir (acac), a red luminescent material, doped with CBP, was formed thereon by the co-evaporation method. Next, a yellow light emitting layer in which Bt2Ir (acac), a yellow luminescent material, doped with CBP, was formed thereon by the co-evaporation method. Then, BCP was deposited thereon by an evaporation method, an electron transport layer was formed. Finally, a cathode was formed by depositing LiF (1 nm thick)/Al (150 nm thick) thereon by the evaporation method, resulting in a white organic EL illuminating device.

When the unevenness of luminance was evaluated for the resultant organic EL illuminating device, the difference in luminance between the central part and the end part was not more than 10%. Since the sheet resistance of the light-transmitting metal electrode applied as the anode became not more than ⅓ of the sheet resistance of ITO, uniform light emission of the resultant device was confirmed.

EIGHTH EXAMPLE

An eighth example is a specific example in which the light-transmitting metal electrode according to the embodiment is applied for an amorphous-silicon solar cell.

The light-transmitting metal electrode according to the third example was formed on a glass substrate. Next, a p-type Si layer was formed with a mixture gas of $PH_3$ and $SiH_4$ thereon using a plasma CVD apparatus. By forming an i-type Si layer with a $SiH_4$ gas, and forming an n-type Si layer with a mixture gas of $B_2H_6$ and $SiH_4$, a pin photoelectric conversion layer was formed.

Current-voltage characteristics of the amorphous-silicon solar cell fabricated by the above-described procedure were evaluated. As a comparative example, a solar cell fabricated in the same way as the eighth example, except for forming ITO at a thickness of 100 nm instead of the light-transmitting metal electrode, was used. In this example, since the sheet resistance of the light-transmitting metal electrode reduced than the sheet resistance of ITO, the resistance loss decreased. As a result, the conversion efficiency has improved from 4.6% to 4.8%.

NINTH EXAMPLE

A ninth example is a specific example in which the light-transmitting metal electrode according to the embodiment is applied for a crystalline-silicon solar cell.

An oxide film on the surface of a crystalline-silicon solar cell substrate in which a p-n junction was formed, was removed by hydrofluoric acid, and then the light-transmitting metal electrode according to the first example was formed at the n-surface side (light radiation surface side). Subsequently, a counter electrode was formed on the p-surface side (rear surface side), by applying an aluminum paste on the entire surface then heating the substrate.

The conversion efficiency of the crystalline-silicon solar cell fabricated by the above-described procedure was evaluated. As a comparative example, a solar cell fabricated in the same way as the ninth example, except for forming a comb-shaped surface electrode instead of the light-transmitting metal electrode, was used. The conversion efficiency of the solar cell according to the comparative example was 6.5%, on the contrary, the conversion efficiency of the crystalline silicon solar cell according to the ninth example was 6.8%.

TENTH EXAMPLE

A tenth example is a specific example in which the light-transmitting metal electrode according to the embodiment is applied for a semiconductor light emitting element.

A semiconductor light emitting element substrate (emission wavelength; 440 nm) was prepared by depositing an n-GaN layer as a buffer layer on a sapphire substrate, and depositing an MQW (multi quantum well) layer composed of n-GaN and InGaN/GaN, a p-AlGaN layer, and a p-GaN layer on the substrate in this order. A p-electrode was formed by forming a 1 nm thick Ni film on the p-surface side, and then forming a film of Ag alloy added with palladium thereon. After that, the light-transmitting metal electrode according to the first example was formed using a nanoimprint method. Subsequently, a 35 nm thick SiN film was formed thereon as an antireflection film and a protection film by sputtering.

After that, figuring of the n-GaN layer was carried out by patterning resist by optical lithography, then patterning SiN by fluorine dry etching and patterning Ag by ion milling, and then etching the p-GaN layer by chlorine dry etching. After that, an n-side electrode was formed by sputtering Ti/Al/Ti on the etched n-GaN surface at a thickness of 10 nm/100 nm/50 nm. An ohmic contact was formed between the electrode layer and the element by annealing the wafer at 650° C. for ten minutes in a nitrogen atmosphere. The semiconductor light emitting element according to the tenth example was fabricated by forming an Au pad electrode on the surfaces of the p-side electrode and the n-side electrode.

As a third comparative example, a semiconductor light emitting element was fabricated, for which, instead of the light-transmitting metal electrode, the light-transmitting metal electrode having circular openings formed therein according to the first comparative example was applied.

Further, as a fourth comparative example, a semiconductor light emitting element fabricated in the same way as the tenth example except for using a 100 nm thick ITO instead of the light-transmitting metal electrode was used.

The current-luminance properties of the semiconductor light emitting element according to the tenth example, and semiconductor light emitting elements according to the third comparative example and the fourth comparative example were evaluated. As a result, the luminance of the semiconductor light emitting element according to the tenth example was larger by 1.2 times than the luminances of the third and fourth comparative examples.

ELEVENTH EXAMPLE

An eleventh example is a specific example in which the light-transmitting metal electrode according to the embodiment is applied for a semiconductor light emitting element.

A semiconductor light emitting element substrate (emission wavelength; 630 nm) was prepared by depositing thereon an n-InGaAlP layer as a cladding layer, an InGaAlP layer as an active layer, a p-InGaAlP layer as a cladding layer, and a p-GaP layer as a current diffusion layer in this order. Next, a metal electrode film consisting of a 10 nm thick Au film and a 30 nm thick Au—Zn alloy film was formed on a current diffusion layer by a vacuum deposition method as a metal electrode layer was formed. Furthermore, a rear electrode was formed by depositing Au—Ge alloy on the rear surface of a GaAs substrate at a thickness of 150 nm using a vacuum deposition method. After that, by sintering the substrate at 650° C. for ten minutes in a nitrogen atmosphere, ohmic contacts were formed between the substrate and the rear electrode layer, and between the current diffusion layer and the metal electrode layer. A structure equivalent to the structure of the light-transmitting metal electrode according to the first example was fabricated using a nanoimprint method. Subsequently, by forming a round-shaped electrode composed of Au on a part of the metal electrode layer, the semiconductor light emitting element according to the eleventh example was fabricated.

As a comparative example, a semiconductor light emitting element was prepared, in which, instead of the metal electrode, a 250 nm thick ITO having an ohmic contact to the current diffusion layer was used. By dicing the element into a 1 mm×1 mm chip, the luminance of the bare chip was measured by a chip tester. As a result, the maximum luminance of the semiconductor light emitting element according to the eleventh example was larger by 1.2 times than the luminance of the comparative example.

TWELFTH EXAMPLE

A twelfth example is a specific example in which the light-transmitting metal electrode according to the embodiment is applied for a semiconductor light emitting element.

A semiconductor light emitting element substrate (emission wavelength; 440 nm) was prepared by depositing thereon an n-GaN layer as a buffer layer, an MQW (multi quantum well) layer composed of n-GaN and InGaN/GaN as a cladding layer, a p-AlGaN layer as a cladding layer, and a p-GaN layer as a contact layer in this order. Subsequently, a p-side electrode layer composed of Ni (1 nm thick)/Au (30 nm thick) was formed on the p-side electrode layer by a vacuum deposition method. Furthermore, an n-side electrode layer composed of Ti (10 nm thick)/Au (100 nm thick) was formed on the rear surface of the substrate, and processed in a desired form. Finally, by subjecting the substrate to heat treatment, ohmic contacts were formed on contact surfaces between the element and each electrode layers. Next, a structure equivalent to the structure of the light-transmitting metal electrode according to the first example was fabricated using a nanoimprint method. Further, by forming a round-shaped electrode composed of Ti/Au on a part of the metal electrode layer, the semiconductor light emitting element according to the twelfth example was fabricated.

As a comparative example, a semiconductor light emitting element was prepared, in which, instead of the metal electrode, a 200 nm thick ITO was formed. By dicing the element into a 300 μm×300 μm chip, the luminance of the bare chip was measured by a chip tester. As a result, the maximum luminance of the semiconductor light emitting element according to the twelfth example was larger by 1.3 times than the maximum luminance of the comparative example.

According to the light-transmitting metal electrode according to the embodiment, for light polarized in any direction, by making the maximum length of straight line part 220 not more than the wavelength of visible light and by providing a plurality of polygonal openings 21 using the plurality of straight line parts 220, oscillation of free electrons occurring in the metal layer 2 can be structurally interrupted and reflection loss can be suppressed. As such, even if the occupancy of the metal nanowire 22 is more than 20% and not more than 80%, a light-transmitting metal electrode having little wavelength dependence and having a resistance lower than the resistance of a conventional transparent conductive oxide, can be provided without vitiating its high transparency.

Further, by applying the optical transparency metal electrode according to the embodiment to electronic apparatuses and light emitting devices, highly efficient devices can be provided.

As described above, according to the embodiments, it is possible to provide a light-transmitting metal electrode, electronic apparatuses and light emitting devices which can achieve sufficient transparency in a broad wavelength range.

Although the embodiments and their modifications have been described above, the invention is not limited to these examples. For example, an example made by a person skilled in the art by suitably adding or deleting constituents or adding design change to/from the above mentioned embodiments or their modifications, or an example made by suitably combining features of the embodiments, will also be included within the scope of the invention, as long as it has the gist of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light-transmitting metal electrode, comprising a metal layer,
the metal layer provided on a major surface of a member and including a metal nanowire and a plurality of openings formed with the metal nanowire,
the metal nanowire including a plurality of first straight line parts along a first direction parallel to the major surface, and a plurality of second straight line parts along a direction parallel to the major surface, and different from and intersecting the first direction,
a maximum length of the plurality of first straight line parts along the first direction and a maximum length of the plurality of second straight line parts along the direction different from the first direction being not more than a wave length of visible light, and
a ratio of an area of the metal nanowire viewed in a normal direction of the major surface to an area of the metal layer viewed in the normal direction being more than 20% and not more than 80%.

2. The electrode according to claim 1, wherein shapes of the plurality of openings viewed in the normal direction are polygon.

3. The electrode according to claim 1, wherein shapes of the plurality of openings viewed in the normal direction are at least one of tetragon, hexagon and octagon.

4. The electrode according to claim 1, wherein a length of the metal nanowire on a straight line connecting centroids of adjacent openings among the plurality of openings is not less than 20 nm and not more than 200 nm.

5. The electrode according to claim 1, wherein a thickness of the metal nanowire is not less than 10 nm and not more than 400 nm.

6. The electrode according to claim 1, wherein the metal nanowire has at least one selected from the group consisting of gold, silver, copper, aluminum, nickel, lead, zinc, platinum, cobalt, magnesium, chromium, tungsten, palladium, indium, antimony, and tin.

7. The electrode according to claim 1, wherein the maximum length of the plurality of first straight line parts along the first direction and the maximum length of the plurality of second straight line parts along a direction different from the first direction are not more than 780 nm.

8. The electrode according to claim 1, further comprising:
a covering layer provided on the metal layer and made of a material different from a material of the metal layer.

9. The electrode according to claim 1, wherein the first straight line part and the second straight line part are orthogonal to each other.

10. The electrode according to claim 1, wherein the plurality of openings are arranged while aligning along each of the first direction and the second direction.

11. The electrode according to claim 1, wherein the plurality of openings have a first opening area and a second opening area different from the first opening area.

12. The electrode according to claim 1, wherein a plurality of first openings having the first opening area and a plurality of second openings having the second opening area are arranged alternately one by one along the major surface.

13. An electronic apparatus comprising:
a structure body having a major surface; and
a metal layer provided on the major surface and including a metal nanowire and a plurality of openings formed with the metal nanowire,
the metal nanowire including a plurality of first straight line parts along a first direction parallel to the major surface, and a plurality of second straight line parts along a direction parallel to the major surface, and different from and intersecting the first direction,
a maximum length of the first straight line parts along the first direction and a maximum length of the second straight line parts along the direction different from the first direction, are not more than a wavelength of visible light,
a ratio of an area of the metal nanowire viewed in a normal direction of the major surface to an area of the metal layer viewed in the normal direction vertical to the major surface being more than 20% and not more than 80%, and
the metal layer being used as an electrode in the structure.

14. The apparatus according to claim 13, wherein
the structure body includes a stacked body supplied electric charges, and
the stacked body includes:
a first-conductivity type first semiconductor layer;
a second-conductivity type second semiconductor layer stacked with the first semiconductor layer along the normal direction; and
a light emitting part provided between the first semiconductor layer and the second semiconductor layer and emitting light according to the electric charges.

15. The apparatus according to claim 13, wherein
the structure body includes a photoelectric conversion layer for converting incident light into an electric signal, and current containing the electric signal flows in the metal layer.

16. The apparatus according to claim 13, wherein the structure body includes one of an optical layer emitting light according to the electric charges and an optical layer changing optical properties including at least any one of birefringence, optical rotatory power, scattering property, diffractive property and absorbency, according to the electric charges.

17. The apparatus according to claim 13, wherein a length of the metal nanowire on a straight line connecting centroids of adjacent openings among the plurality of openings is not less than 20 nm and not more than 200 nm.

18. A light emitting device comprising:
an optical member having a light transmitting part and a major surface, and
a metal layer provided on the major surface and including a metal nanowire and a plurality of openings formed with the metal nanowire,
the metal nanowire including a plurality of first straight line parts along a first direction parallel to the major surface, and a plurality of second straight line parts along a direction parallel to the major surface, and different from and intersecting the first direction;
a maximum length of the plurality of first straight line parts along the first direction and a maximum length of the second straight line parts along the direction different from the first direction being not more than a wavelength of visible light, and
a ratio of an area of the metal nanowire viewed in a normal direction to an area of the metal layer viewed in the normal direction of the major surface being more than 20% and not more than 80%.

19. The device according to claim 18, further comprising:
a covering layer provided on the metal layer and made of a material different from a material of the metal layer.

20. The device according to claim 18, wherein a length of the metal nanowire on a straight line connecting centroids of adjacent openings among the plurality of openings is not less than 20 nm and not more than 200 nm.

* * * * *